United States Patent
Namikawa et al.

(10) Patent No.: US 6,527,876 B2
(45) Date of Patent: *Mar. 4, 2003

(54) SILICON STEEL SHEET AND METHOD FOR PRODUCING THE SAME

(75) Inventors: Misao Namikawa, Kawasaki (JP); Yoshikazu Takada, Kawasaki (JP); Shoji Kasai, Kawasaki (JP); Hironori Ninomiya, Machida (JP); Tsunehiro Yamaji, Kawasaki (JP); Tatsuhiko Hiratani, Fukuyama (JP)

(73) Assignee: NKK Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/423,509

(22) PCT Filed: Mar. 5, 1999

(86) PCT No.: PCT/JP99/01063
§ 371 (c)(1),
(2), (4) Date: Jan. 24, 2000

(87) PCT Pub. No.: WO99/46417
PCT Pub. Date: Sep. 16, 1999

(65) Prior Publication Data
US 2002/0134466 A1 Sep. 26, 2002

(30) Foreign Application Priority Data

| Mar. 12, 1998 | (JP) | 10-078620 |
| Apr. 7, 1998 | (JP) | 10-110093 |
| Apr. 7, 1998 | (JP) | 10-110094 |
| Apr. 7, 1998 | (JP) | 10-110095 |
| Apr. 10, 1998 | (JP) | 10-114356 |
| Apr. 10, 1998 | (JP) | 10-114357 |
| Apr. 10, 1998 | (JP) | 10-114360 |
| Apr. 10, 1998 | (JP) | 10-114363 |
| Jul. 29, 1998 | (JP) | 10-213895 |

(51) Int. Cl.$^7$ ............................................. H01F 1/147
(52) U.S. Cl. ........................ 148/307; 148/308; 148/113
(58) Field of Search ......................... 148/110–113, 307, 148/308; 420/117

(56) References Cited

U.S. PATENT DOCUMENTS

| 4,832,762 A | * | 5/1989 | Nakaoka et al. | 148/108 |
| 5,089,061 A | * | 2/1992 | Abe et al. | 148/110 |
| 5,993,568 A | * | 11/1999 | Takada et al. | 148/307 |

FOREIGN PATENT DOCUMENTS

| JP | 62-227033 | * | 10/1987 |
| JP | 62-227034 | * | 10/1987 |
| JP | 62-227035 | * | 10/1987 |
| JP | 62-227036 | * | 10/1987 |
| JP | 7-233453 u | | 9/1995 |
| JP | 9-184051 | | 7/1997 |
| JP | 10-140299 | | 5/1998 |
| JP | 10-140300 | | 5/1998 |

* cited by examiner

*Primary Examiner*—John Sheehan
(74) *Attorney, Agent, or Firm*—Frishauf, Holtz, Goodman & Chick, P.C.

(57) ABSTRACT

A silicon steel sheet having low iron loss of high frequency has a surface layer of the steel sheet which has Si concentration higher than Si concentration of a center portion of the steel sheet. Si concentration of sheet thickness center is 3.4 wt. % or more and Si concentration of the surface layer of the steel sheet is 5 wt. % or more. Si concentration in a surface layer portion is 5 to 8 wt. %. The production method comprises siliconizing treatment and diffusing treatment. Velocity of siliconizing and diffusing are controlled, and Si concentration distribution in the sheet thickness direction of the steel sheet is controlled.

10 Claims, 11 Drawing Sheets

RATIO OF PERMEABILITY OF STEEL SHEET SURFACE LAYER TO PERMEABILITY OF SHEET CENTER

SILICONIZING-DIFFUSING

SILICON STEEL SHEET AND METHOD FOR PRODUCING THE SAME

This application is a U.S. national phase application of International Application PCT/JP99/01063 filed Mar. 5, 1999.

FIELD OF TECHNOLOGY

The present invention relates to a silicon steel sheet which is suitable for iron cores used for such as a transformer, a reactor and a motor and a method for producing the same.

BACKGROUND OF TECHNOLOGY

It is in general known that iron loss of a silicon steel sheet rises drastically when exciting frequency becomes high. On the other hand, driving frequency of such as a transformer, a reactor and a motor for which the silicon steel sheet is widely used has recently been made yearly to be of higher frequency in order that an iron core is made to be compacted and to be highly efficient.

Accompanied by this driving frequency being made to be of higher frequency, a case that temperature rise and efficiency deterioration of these iron cores owing to iron loss of the silicon steel sheet invite a problem is remarkably increasing. For such reason, it has become demanded that high frequency iron loss of the silicon steel sheet is reduced.

As conventional method of reducing high frequency iron loss of the silicon steel sheet, a method of reducing high frequency iron loss by increasing resistivity by means of increasing Si content in the silicon steel sheet and a method of reducing high frequency iron loss by suppressing eddy current loss by means of thinning sheet thickness have been employed.

Since the method of increasing Si content in the silicon steel sheet, however, among the above described conventional technologies, deteriorates formability of the silicon steel sheet remarkably, there is a problem that not only deterioration of productivity of the silicon steel sheet itself is invited but also increase in cost for producing iron cores is invited.

On the other hand, so far as the method of thinning the sheet thickness is also concerned, the thinner the sheet thickness is, the more cost for producing the steel sheet itself increases, and still further more increase in cost for producing a core is invited since a piling number of sheets increases. Thus, there is also a problem which the method of thinning the sheet thickness has.

In response to the above circumstances, siliconizing method has been developed as a method of producing a high Si steel sheet which is poor in formability and in particular a 6.5% silicon steel sheet excellent in magnetic properties is produced. According to the siliconizing method, it means technology in which after a low silicon steel plate has been rolled into a silicon steel sheet, Si is made to be permeated and diffused from surface of the steel sheet.

Recently, however, an electric appliance has remarkably been made to be of higher frequency and a material which has lower iron loss than a 6.5% silicon steel sheet has been demanded.

DISCLOSURE OF INVENTION

It is an object of the present invention to provide a silicon steel sheet having low iron loss of high frequency and a method for producing the same.

To attain the object, firstly, the present invention provides a silicon steel sheet having low iron loss of high frequency which comprises:

a steel sheet surface layer and a steel sheet center portion;

the steel sheet surface layer having Si concentration higher than Si concentration of the steel sheet center portion;

Si concentration of steel sheet center being 3.4 wt. % or more; and

Si concentration of the steel sheet surface layer being 5 wt. % or more.

Secondly, the present invention provides a silicon steel sheet having low iron loss of high frequency which comprises:

a portion of at least 10% from both of upper surface and lower surface of a steel sheet in sheet thickness direction having Si concentration of 5 to 8 wt. %; and Si concentration in the vicinity of sheet thickness center being at least 3.4 wt. %.

Thirdly, the present invention provides a silicon steel sheet having high saturation magnetic flux density and low iron loss of high frequency which comprises:

a steel sheet having a Si concentration gradient in sheet thickness direction;

the steel sheet having a surface layer and a steel sheet center portion, the surface layer having Si concentration higher than Si concentration of the steel sheet center portion; and an average Si concentration being 3.5% or less in sheet thickness direction of the steel sheet.

Fourthly, the present invention provides a soft magnetic strip having low iron loss of high frequency which comprises:

a strip having a surface and a center portion; and a magnetic permeability of the surface having two times or more of a magnetic permeability of the strip center portion.

Fifthly, the present invention provides a soft magnetic strip having low iron loss of high frequency which comprises:

a soft magnetic strip comprising a silicon steel sheet having a Si concentration gradient in thickness direction and having a strip surface and a strip center portion; and a magnetic permeability of the strip surface having two times or more of a magnetic permeability of the strip center portion.

Sixthly, the present invention provides a silicon steel sheet having low iron loss of high frequency which comprises:

Si concentration in a surface layer portion of 10% or more from both of upper surface and lower surface of a steel sheet in sheet thickness direction being 5 to 8 wt. %; and Si concentration in the vicinity of sheet thickness center being 2.2 to 3.5 wt. %.

Seventhly, the present invention provides a silicon steel sheet having excellent in magnetic properties of high frequency which comprises:

a silicon steel sheet having a Si concentration gradient in sheet thickness direction and having a surface layer and a steel sheet center portion;

the surface layer having Si concentration higher than Si concentration of the steel sheet center portion;

a difference between a maximum and a minimum of Si concentration in sheet thickness direction being 0.3 wt. % or more;

Si concentration of the surface layer being 5 to 8 wt. %; and a difference between front surface layer and back surface layer being 1 wt. % or less.

Eighthly, the present invention provides a method for producing a silicon steel sheet having excellent magnetic properties of high frequency, which comprises the steps of:

performing simultaneously siliconizing treatment of penetrating Si from a steel sheet surface and diffusing treatment of diffusing the penetrated Si in a steel sheet in non-oxidizing atmosphere which includes Si compound; and controlling velocity of siliconizing and diffusing so that Si concentration of a surface layer is higher than Si concentration of a sheet thickness center portion, a difference between a maximum and a minimum of Si concentration in sheet thickness direction is 0.3 wt. % or more, Si concentration of the surface layer is 5 to 8 wt. % and a difference between front surface layer and back surface layer is 1 wt. % or less.

Ninthly, the present invention provides a method for producing a silicon steel sheet having excellent magnetic properties of high frequency, which comprises the steps of:

subjecting a steel sheet to siliconizing treatment in non-oxidizing atmosphere which includes Si compound;

performing diffusing treatment of Si in non-oxidizing atmosphere which does not include Si compound; and controlling velocity of diffusing in the step of the performing the diffusing treatment so that Si concentration of a surface layer is higher than Si concentration of a sheet thickness center portion, a difference between a maximum and a minimum of Si concentration in sheet thickness direction is 0.3 wt. % or more, Si concentration of the surface layer is 5 to 8 wt. % and a difference between front surface layer and back surface layer is 1 wt. % or less.

Tenthly, the present invention provides a grain-oriented silicon steel sheet having low iron loss, which comprises:

a sheet thickness of 0.2 mm or more;

C in an amount of 0.01 wt. % or less;

Si concentration in a surface layer portion of 10% or more from both of upper surface and lower surface of a steel sheet in sheet thickness direction being 5 to 8 wt. %; and Si concentration in the vicinity of sheet thickness center being 2.2 to 3.5 wt. %.

Eleventhly, the present invention provides a grain-oriented silicon steel sheet having low iron loss, which comprises:

a sheet thickness of less than 0.2 mm;

C in an amount of 0.01 wt. % or less;

Si concentration in a surface layer portion of 10% or more from both of upper surface and lower surface of a steel sheet in sheet thickness direction being 5 to 8 wt. %; and Si concentration in the vicinity of sheet thickness center being 3 to 6 wt. %.

Twelfthly, the present invention provides a silicon steel sheet having excellent magnetic aging property and residual magnetic flux density, which comprises:

0.003 wt. % or less C, 0.05–0.5 wt. % Mn, 0.01 wt. % or less P, 0.02 wt. % or less S, 0.001–0.06 wt. % sol. Al and 0.01 wt. % or less N;

an average Si of 7 wt. % or less; and the steel sheet having a Si concentration gradient in sheet thickness direction, Si concentration of a surface layer being higher than Si concentration of a sheet thickness center portion and a difference between a maximum and a minimum of Si concentration being 0.5 wt. % or more.

Thirteenthly, the present invention provides a method for producing a silicon steel sheet, which comprises the steps of:

performing siliconizing treatment of penetrating Si from a steel sheet surface and diffusing treatment of diffusing the penetrated Si in a steel sheet in the same furnace and in the same gaseous atmosphere; and controlling velocity of siliconizing and diffusing by means of controlling treatment time and treatment interval for the siliconizing treatment and the diffusing treatment to control Si concentration distribution in steel sheet thickness direction.

Fourteenthly, the present invention provides a method for producing a silicon steel sheet, which comprises the steps of:

performing simultaneously siliconizing treatment of penetrating Si from a steel sheet surface and diffusing treatment of diffusing the penetrated Si in a steel sheet in the same atmosphere; and controlling velocity of siliconizing and diffusing to control Si concentration distribution in steel sheet thickness direction.

BEST MODE OF CARRYING OUT THE INVENTION

Best Mode 1

The inventors of the present invention found that by means of forming Si concentration gradient so as for Si concentration of surface layer to become high in the steel sheet thickness direction and by defining Si concentration of steel sheet center and Si concentration of surface layer within a specific range, iron loss of the silicon steel sheet, in particular, iron loss of high frequency can be remarkably reduced.

Best mode 1 has been completed based on such knowledge. Firstly, the best mode 1 provides a silicon steel sheet having extremely low iron loss of high frequency which is characterized in that Si concentration of steel sheet surface layer is higher than Si concentration of steel sheet center portion; Si concentration of steel sheet center is 3.4 wt. % or more; and Si concentration of steel sheet surface layer is 5 wt. % or more.

Secondly, the best mode 1 provides a silicon steel sheet having extremely low iron loss of high frequency as defined above which is characterized in that Si concentration of steel sheet surface layer is substantially 6.5 wt. %.

Thirdly, the best mode 1 provides a silicon steel sheet having extremely low iron loss of high frequency which is characterized in that the silicon steel sheet comprises: 0.02 wt. % or less C, 0.05–0.5 wt. % Mn, 0.01 wt. % or less P, 0.02 wt. % or less S, 0.001–0.06 wt. % sol. Al and 0.01 wt. % or less N; portion having Si concentration of 5 to 8 wt. % is 10% or more of sheet thickness in the thickness direction from both an upper surface layer and a lower surface layer of the steel sheet; and Si concentration in the vicinity of sheet thickness center is 3.4 wt. % or more.

Now the best mode 1 will be described in detail.

The silicon steel sheet according to the best mode 1 is basically a silicon steel sheet in which Si concentration of steel sheet surface layer is higher than Si concentration of steel sheet center portion; in which Si concentration of steel sheet center is 3.4 wt. % or more; and in which Si concentration of steel sheet surface layer is 5 wt. % or more.

Figure 1:
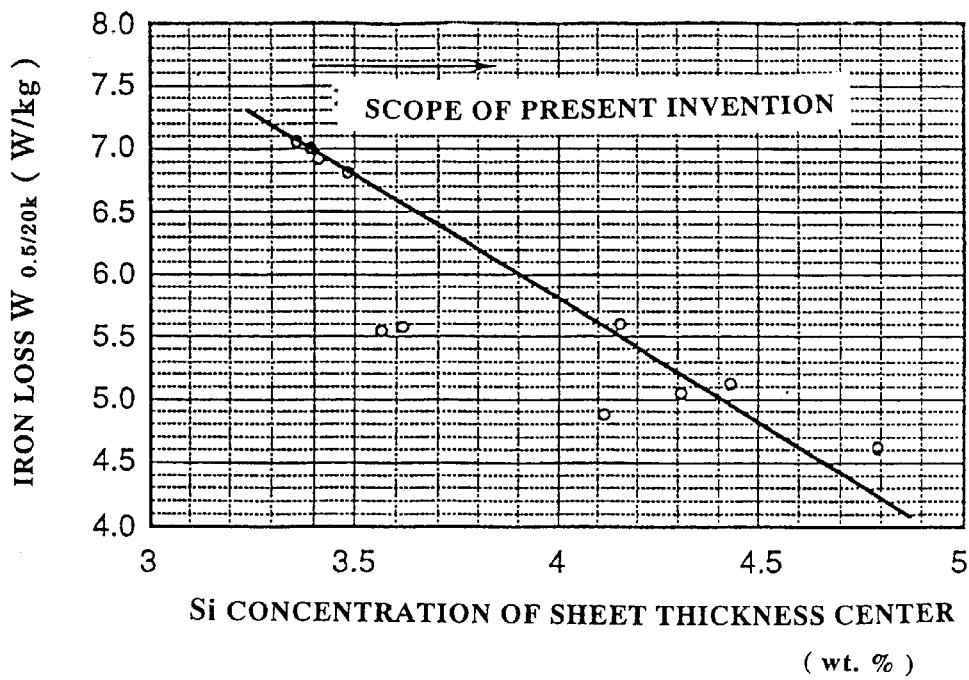
FIG. 1 is a view of showing, with respect to best mode 1, relation between Si concentration of a sheet thickness center and iron loss W 0.5/20 k in case that Si concentration distribution is formed in sheet thickness direction.

FIG. 1 is a graph showing relation between Si concentration of sheet thickness center and iron loss $W_{0.5/20\ k}$ (iron loss value at frequency of 20 kHz and at magnetic flux density of 0.5 kGauss) in case that Si concentration distribution is formed in sheet thickness direction.

It should be noted that the Si concentration is a result of analysis by EPMA (an electron probe micro-analyzer) with a cross section of a sample. In addition, here a Si steel sheet of 3 wt. % which was produced by rolling method of sheet thickness of 0.1 mm was subjected to siliconizing treatment in atmosphere of $SiCl_4$ at 1200° C. and thereafter subjected to diffusion treatment in atmosphere of $N_2$ at 1200° C. using samples which formed various Si concentration distributions.

It is understood from FIG. 1 that iron loss of high frequency equal to iron loss value of $W_{0.5/20\ k}$=6.9 W/kg or less of silicon steel sheet of 6.5 wt. % of Fe—Si alloy which is most excellent in soft magnetic property can be obtained if Si amount of sheet thickness is to be 3.4 wt. % or more. Therefore, in the present invention Si amount is defined to be 3.4 wt. % or more. From point of view of obtaining formability and lower iron loss, it is preferable that Si amount of sheet thickness center is made to be 7 wt. % or less.

Figure 2:
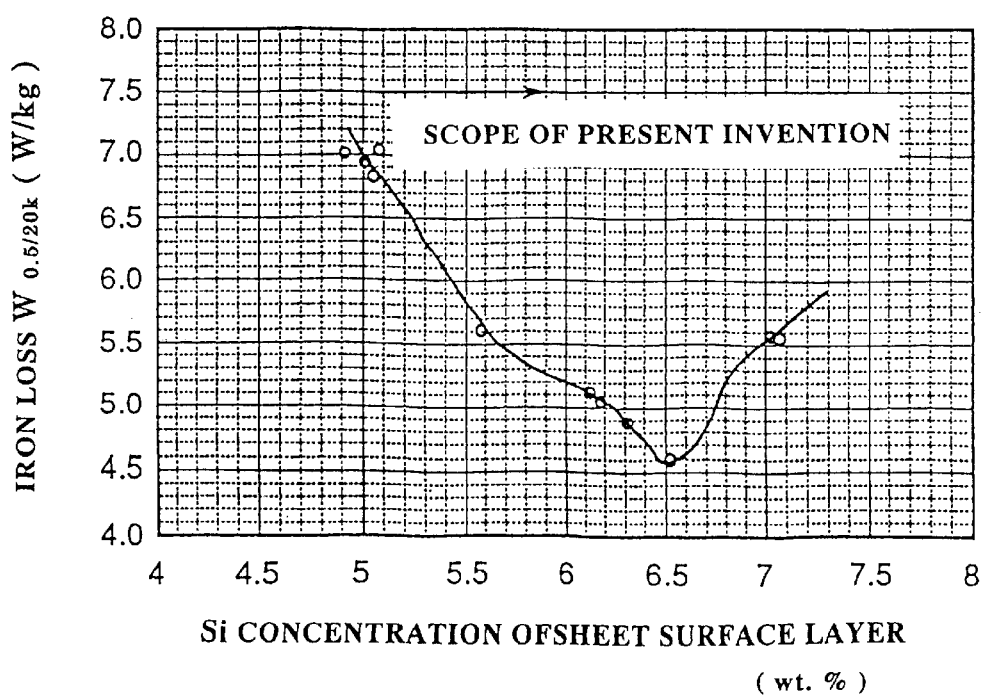
FIG. 2 is a view of showing, with respect to best mode 1, relation between Si amount of a steel sheet surface layer and iron loss W 0.5/20 k in case that Si concentration distribution is formed in sheet thickness direction.

FIG. 2 is a graph showing relation between Si amount of steel sheet surface layer and iron loss $W_{0.5/20\ k}$ with regard to a sample shown in FIG. 1. It is understood that from FIG. 2 that by making Si amount 5 wt. % or more iron loss of high frequency less than iron loss value of $W_{0.5/20\ k}$=6.9W/kg of a silicon steel sheet of 6.5% can be obtained. In addition, by making Si 5.5 wt. % or more less iron loss of high frequency can be obtained, and, in particular, in case that Si is equal to 6.5 wt. % remarkably low iron loss of high frequency of $W_{0.5/20\ k}$=4.6 is marked. From this fact, it is necessary that Si concentration of surface layer is defined to be 5 wt. % or more, preferably to be 5.5 wt. % or more, and furthermore preferably to be 6.5 wt. %.

It is preferable that ratio of depth of portion of Si concentration of 5 wt. % or more from surface layer is 10% or more, and it is more preferable 15 to 25%. Thanks to this, low iron loss of high frequency can be surely obtained. The upper limit of Si concentration in portion of high Si concentration of steel sheet surface layer is not especially defined from view point of iron loss property. Since, however, formability is remarkably deteriorated if Si concentration is over 8 wt. %, it is preferable that Si concentration is 8 wt. % or less.

Material which has, in this manner, high Si concentration of surface layer and low Si concentration of sheet thickness center portion is disclosed in Japanese printed patent No. 2541383, Japanese unexamined printed publication No. 6-17202 and Japanese unexamined printed publication No. 9-184051. The Japanese patent No. 2541383, however, proposes a silicon steel sheet having high Si concentration of a surface layer which is obtained as the result of shortening time for diffusion treatment so as to improve productivity when a silicon steel sheet of 6.5 wt. % is produced, and the iron loss is equal to that of the silicon steel sheet of 6.5 wt. %. In addition, the Japanese unexamined printed publication No. 6-17202 discloses a silicon steel sheet of 6.5 wt. % Si of only surface layer so as to improve formability of a silicon steel sheet of 6.5 wt. %, and the iron loss is deteriorated compared with the silicon steel sheet of 6.5 wt. %. Still furthermore, the Japanese unexamined printed publication No. 9-184051 proposes a high Si steel sheet of surface layer so as to reduce residual magnetic flux density, which is different from the object of the present invention. So far as iron loss is concerned, in case of iron loss of 50 Hz material of high Si of surface layer is low. If frequency, however, becomes high, iron loss is usually considered to generally be controlled by total Si amount and so far as material having low Si amount of thickness center portion is concerned, iron loss property is considered to be inferior.

In regard to this, the best mode 1 is based on the firstly found knowledge that sheet thickness center in sheet thickness direction forms concentration gradient of lower Si concentration, being different from such conventional technological common sense, and defines Si concentration of sheet thickness center and Si concentration of steel sheet surface layer in a specific range, whereby material having extremely low iron loss of high frequency can be obtained.

In the best mode 1, constituents other than Si are not especially limited and usually in a range of a steel sheet of this kind. Namely it is preferable that they are in a range of 0.02 wt. % or less C, 0.05–0.5 wt. % Mn, 0.01 wt. % or less P, 0.02 wt. % or less S, 0.001–0.06 wt. % sol. Al and 0.01 wt. % or less N.

When C is contained much, that will brings about magnetic aging. For this reason, the upper limit is defined to be 0.02 wt. %. The lower limit is not especially defined. From economically removal point of view, however, the lower limit is preferably defined to be 0.01 wt. %.

When Mn is contained much, a steel sheet becomes brittle. Therefore, the upper limit is preferably defined to be 0.5 wt. %. When, however, the content is too low, fracture and surface defect during hot rolling process is invited. Therefore, the lower limit is preferably defined to be 0.05 wt. %.

P is a preferable element from magnetic property point of view. If it, however, is contained much, that deteriorates formability of a steel sheet. For this reason, the upper limit is defined to be 0.01 wt. %. The lower limit is not especially defined, but from economical removal point of view the lower limit is preferably defined to be 0.001 wt. %.

Since S deteriorates formability, it is preferable that the upper limit is determined to be 0.02 wt. %. The lower limit is not especially defined from view point of the property, but from economical removal point of view the lower limit is preferably defined to be 0.001 wt. %.

Since sol. Al deteriorates formability similarly, the upper limit is preferably defined to be 0.06 wt. %. On the other hand, because of necessity of sol. Al being as deoxidizer the lower limit is defined to be 0.001 wt. %.

If N is contained much, nitride is formed so that magnetic property is deteriorated. For this reason, it is necessary that the upper limit is preferably determined to be 0.01 wt. %. The lower limit is not especially defined from view point of the property, but according to the present steel-making technology the lower limit is determined to be 0.0001 wt. % in fact.

In the present invention, method of forming high Si concentration portion of steel sheet surface layer may be CVD, PVD or any other method, and is not especially limited. In addition, the effect of the present invention is not dependent on sheet thickness of a silicon steel sheet, and by making any sheet thickness fall in the range defined in the present invention, iron loss can be remarkably reduced, but, in particular, it is effective for a steel sheet of 0.2 mm or less in thickness. Furthermore, Si distribution in sheet thickness direction is preferably symmetrical with regard to an upper surface and a lower surface. The effect of the present invention, however, can be obtained even if Si distribution in sheet thickness direction is asymmetrical with regard to the upper surface and the lower surface. The upper surface and the lower surface are not necessarily symmetrical so long as it is in a range in which shape of a steel sheet can be kept. Furthermore, the present invention features extremely low iron loss of high frequency, and above all, it is effective in region of lower magnetic flux density.

EXAMPLE

Example 1

A steel sheet having constituents shown in Table 1 with thickness of 0.1 mm was produced by method of rolling, subjected to siliconizing treatment in atmosphere of $SiCl_4$ at 1200° C. and thereafter subjected to diffusion treatment in atmosphere of $N_2$ at 1200° C. to produce a silicon steel sheet having various Si concentration distributions. Si concentration distributions were analyzed by EPMA (an electron probe micro-analyzer) with regard to a cross section of a sample. Elements other than Si hardly changed before and after siliconizing treatment and diffusion treatment.

TABLE 1

| | wt. % | | | | | |
|---|---|---|---|---|---|---|
| C | Si | Mn | P | S | sol. Al | N |
| steel sheet constituents 0.003 | 3.0 | 0.01 | 0.003 | 0.0003 | 0.001 | 0.002 |

From the steel sheet thus produced a ring sample having 31 mm of outer diameter and 19 mm of inner diameter was taken and alternating current magnetic property at frequency of 20 kHz and magnetic flux density of 0.05 T was measured. The results are shown in Table 2. In order to make comparison, a ring sample having 31 mm of outer diameter and 19 mm of inner diameter was taken from a silicon steel sheet of 6.5 wt. % with thickness of 0.1 mm and alternating current magnetic property at frequency of 20 kHz and magnetic flux density of 0.05 T was measured. The iron loss value was $W_{0.5/20\,k}$=6.94 W/kg.

TABLE 2

| Si concentration of sheet thickness center (wt. %) | Si concentration of surface layer (wt. %) | Iron loss $W_{0.5/20k}$ (W/kg) | Remarks |
|---|---|---|---|
| 6.5 | 6.5 | 6.94 | Comparative example |
| 3.36 | 5.08 | 7.05 | Comparative example |
| 3.39 | 4.91 | 7.01 | Comparative example |
| 3.41 | 5.01 | 6.94 | Present invention |
| 3.48 | 5.04 | 6.81 | Present invention. |
| 3.57 | 7.06 | 5.53 | Present invention |
| 3.62 | 7.03 | 5.57 | Present invention. |
| 4.15 | 5.58 | 5.60 | Present invention |

TABLE 2-continued

| Si concentration of sheet thickness center (wt. %) | Si concentration of surface layer (wt. %) | Iron loss $W_{0.5/20k}$ (W/kg) | Remarks |
|---|---|---|---|
| 4.12 | 6.33 | 4.88 | Present invention |
| 4.31 | 6.18 | 5.04 | Present invention. |
| 4.43 | 6.12 | 5.11 | Present invention |
| 4.79 | 6.54 | 4.60 | Present invention |

FIG. 1 is a graph showing relation between Si amount of steel sheet thickness center portion and iron loss $W_{0.5/20\ k}$, based on the results of Table 2. It has been confirmed from FIG. 1 that iron loss of high frequency lower equal to or lower than 6.94 W/kg which is iron loss value of a silicon steel sheet of 6.5 wt. % if Si amount of steel sheet thickness center portion is made to be 3.4 wt. % or more.

FIG. 2 is a graph showing relation between Si amount of steel sheet surface layer and iron loss $W_{0.5/20\ k}$, based on the results of Table 2. It has been confirmed from FIG. 2 that by making Si amount of steel sheet surface layer 5 wt. % or more, iron loss of high frequency lower than $W_{0.5/20\ k}$=6.94 W/kg which is iron loss value of a silicon sheet of 6.5 wt. % can be obtained. In addition, it has been confirmed that by making Si 5.5 wt. % or more, lower iron loss of high frequency is obtained, and that, in particular, in case Si is 6.5 wt. % remarkably low iron loss of high frequency which is $W_{0.5/20\ k}$=4.6 W/kg is marked.

Best Mode 2

The inventors of the present invention found that by forming Si concentration gradient so as for Si concentration of surface layer to become high in steel sheet thickness direction, iron loss of high frequency is reduced, by defining Si concentration of average of whole steel sheet thickness within a specific range, high saturation magnetic flux density can be reduced, and by defining Si concentration of steel sheet surface layer within a specific range, iron loss of high frequency can be more reduced.

Best mode 2 has been completed based on such knowledge. Firstly, the best mode 2 provides a silicon steel sheet having high saturation magnetic flux density and low iron loss of high frequency which is characterized in that the silicon steel sheet has Si concentration gradient in steel sheet thickness direction; Si concentration of surface layer is higher than Si concentration of steel sheet center portion; and Si concentration of average of whole steel sheet thickness is 3.5 wt. % or less.

Secondly, the best mode 2 provides a silicon steel sheet having high saturation magnetic flux density and low iron loss of high frequency as defined above which is characterized in that Si concentration of steel sheet surface layer is 4 wt. % or more.

Thirdly, the best mode 2 provides a silicon steel sheet having high saturation magnetic flux density and low iron loss of high frequency as either of firstly or secondly above defined which is characterized in that Si concentration of steel sheet surface layer is substantially 6.5 wt. %.

Fourthly, the best mode 2 provides a silicon steel sheet having high saturation magnetic flux density and low iron loss of high frequency as secondly or thirdly above defined which is characterized in that ratio of depth of Si concentration portion of surface layer of 4 wt. % or more is 10% or more.

Now the best mode 2 will be described in detail.

The silicon steel sheet according to the best mode 2 has basically Si concentration gradient in steel sheet thickness direction; Si concentration of surface layer is higher than Si concentration of steel sheet center portion; and Si concentration of average of whole steel sheet thickness is 3.5 wt. % or less.

Figure 3:
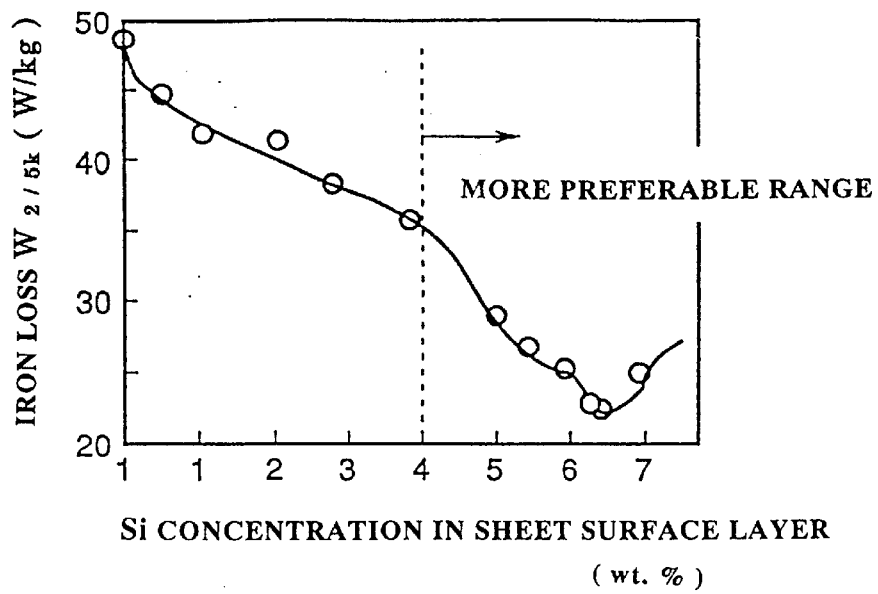
FIG. 3 is a view of showing, with respect to best mode 2, relation between Si concentration of a surface layer and iron loss W 0.5/20 k in case that Si concentration distribution is formed in sheet thickness direction.

FIG. 3 is a graph showing relation between Si concentration of steel sheet surface layer and iron loss $W_{2/5\ k}$ (iron loss value at frequency of 5 kHz and at magnetic flux density of 0.2 T). Here the Si concentration is a result of analysis by EPMA (an electron probe micro-analyzer) with regard to a cross section of a sample. In addition, here a steel sheet which was produced by rolling method of Si of substantially 0 and of sheet thickness of 0.35 mm was subjected to siliconizing treatment in atmosphere of $SiCl_4$ at 1200° C. and thereafter subjected to diffusion treatment in atmosphere of $N_2$ at 1200° C. using samples which formed various Si concentration distributions. Since Si concentration of the mother material is substantially 0, the horizontal axis of FIG. 1 shows difference between Si concentration of steel sheet surface layer and Si concentration of sheet thickness center.

It is understood from FIG. 3 that iron loss of high frequency of W2/5 k is reduced by making the steel sheet have Si concentration gradient in steel thickness direction and by making Si concentration of steel sheet surface layer higher than Si concentration of steel sheet thickness center portion. In addition, it is understood that by making Si amount of steel sheet surface layer 4 wt. % or more by far lower iron loss of high frequency is obtained and that, in particular, by making Si amount of steel sheet surface layer 6.5% remarkably low iron loss is obtained.

Figure 4:
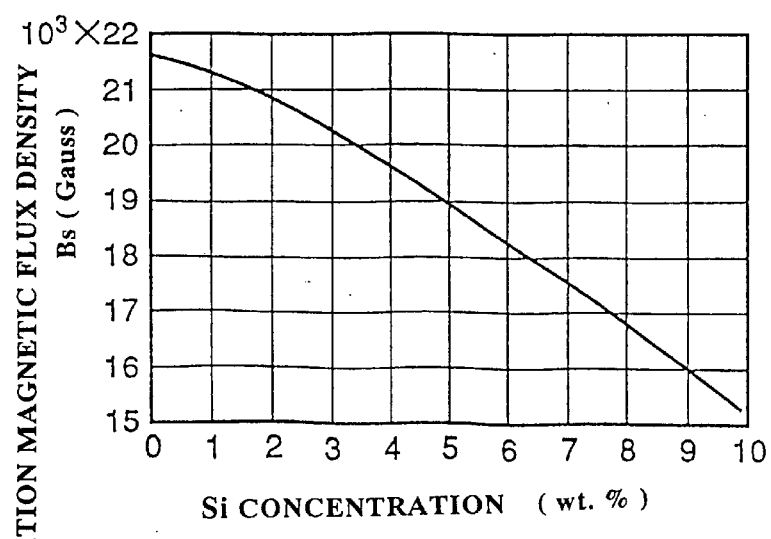
FIG. 4 is a view of showing, with respect to best mode 2, relation between Si amount of a silicon steel sheet and saturation magnetic flux density.

As shown in FIG. 4 (the source: R. M. Bozorth, Ferromagnetusm, van Nostrand, N.Y., 1951), the less Si amount is, the higher saturation magnetic flux density is, and in particular, if Si amount is 3.5 wt. % or less saturation magnetic flux density of 2.0 T (tesla) or more which is extremely high value is obtained. Therefore, in the present invention, as terms and conditions of obtaining high saturation magnetic flux density Si concentration of average whole steel sheet thickness is defined to be 3.5 wt. % or less.

From the results as described above, in the best mode 2, as terms and conditions of reducing iron loss of high frequency while high saturation magnetic flux density is kept high, Si concentration gradient in which Si concentration of surface layer is in sheet thickness direction lower than Si concentration of center portion is formed and Si concentration of average whole steel sheet thickness is defined to be 3.5 wt. % or less.

The upper limit of Si concentration of high Si concentration portion of steel sheet surface layer is not especially defined from iron loss property point of view. Since, however, formability of the steel sheet is remarkably deteriorated if Si concentration is over 8 wt. %, it is preferable that Si concentration is 8 wt. % or less. In addition, ratio of depth of portion of Si concentration of surface layer of 4 to 8 wt. % is preferably defined to be 10% or more and more preferably to be 15 to 25%. Thanks to this, low iron loss of high frequency can be surely obtained.

A material which has, in this manner, high Si concentration of surface layer and low Si concentration of sheet thickness center portion is disclosed in Japanese patent No. 2541383, Japanese unexamined patent publication No.6-17202 and Japanese unexamined patent publication No. 9-184051. The Japanese patent No. 2541383, however, proposes a silicon steel sheet having high Si concentration of surface layer which is obtained as the result of shortening time for diffusion treatment so as to improve productivity when a silicon steel sheet of 6.5 wt. % is produced by siliconizing treatment, and the iron loss is equal to that of the silicon steel sheet of 6.5 wt. %. In addition, the Japanese unexamined patent publication No. 6-17202 discloses a silicon steel sheet of 6.5 wt. % Si of only surface layer so as to improve formability of a a silicon steel sheet of 6.5 wt. %, and the iron loss is deteriorated compared with the silicon steel sheet of 6.5 wt. %. Still furthermore, the Japanese unexamined printed publication No. 9-184051 proposes a high Si steel sheet of surface layer so as to reduce residual magnetic flux density, which is different from the object of the present invention.

In the present invention, constituents other than Si are not especially limited and are satisfactory in a usual range of a steel sheet of this kind. Namely it is preferable that they are in a range consisting of 0.02 wt. % or less C, 0.05–0.5 wt. % Mn, 0.01 wt. % or less P, 0.02 wt. % or less S, 0.001–0.06 wt. % sol. Al and 0.01 wt. % or less N.

When C is contained much, that will brings about magnetic aging. For this reason, the upper limit is preferably defined to be 0.02 wt. %. The lower limit is not especially defined from the property point of view. From economically removing point of view, however, the lower limit is preferably defined to be 0.01 wt. %.

When Mn is contained much, a steel sheet becomes brittle. Therefore, the upper limit is preferably defined to be 0.5 wt. %. When, however, the content is too low, fracture and surface defect during hot rolling process is invited. Therefore, the lower limit is preferably defined to be 0.05 wt. %.

P is a preferable element from magnetic property point of view. If it, however, is contained much, that deteriorates formability of a steel sheet. For this reason, the upper limit is defined to be 0.01 wt. %. The lower limit is not especially defined from the property point of view, but from economically removing point of view the lower limit is preferably defined to be 0.001 wt. %.

Since S deteriorates formability, it is preferable that the upper limit is determined to be 0.02 wt. %. The lower limit is not especially defined from the property point of view, but from economically removing point of view the lower limit is preferably defined to be 0.001 wt. %.

Since sol. Al deteriorates formability similarly, the upper limit is preferably defined to be 0.06 wt. %. On the other hand, because of necessity of sol. Al being as deoxidizer the lower limit is preferably defined to be 0.001 wt. %.

If N is contained much, nitride is formed so that magnetic property is deteriorated. For this reason, the upper limit is preferably determined to be 0.01 wt. %. The lower limit is not especially defined from the property point of view, but according to the present steel-making technology the lower limit is determined to be 0.0001 wt. % in fact.

In the present invention, method of forming high Si concentration portion of steel sheet surface layer may be CVD, PVD or any other method, and is not especially limited. In addition, the effect of the present invention is not dependent on thickness of a silicon steel sheet, and even if it is any sheet thickness by making it fall in the range defined in the present invention, iron loss can be remarkably reduced. Reduction effect of iron loss in the present invention is remarkable, in particular, for a steel sheet of 0.2 mm or more in thickness. Furthermore, Si distribution in sheet thickness direction is preferably symmetrical with regard to an upper surface and a lower surface. The effect of the present invention, however, is obtained even if Si distribution in sheet thickness direction is asymmetrical with regard to the upper surface and the lower surface. The upper surface and the lower surface are not necessarily symmetrical so long as it is in a range in which shape of a steel sheet can be kept. Average Si concentration of the present invention is obtained by chemical analysis.

EXAMPLE

Now an example of the best mode 2 will be described below.

Example 1

A steel sheet having constituents shown in Table 3 with thickness of 0.35 mm was produced by method of rolling, subjected to siliconizing treatment in atmosphere of $SiCl_4$ at 1200 ° C. and thereafter subjected to diffusion treatment in atmosphere of $N_2$ at 1200° C. to produce a silicon steel sheet having various Si concentration distributions. Si concentration distributions were analyzed by EPMA (an electron probe micro-analyzer) with regard to a cross section of a sample. Elements other than Si hardly changed in amount before and after siliconizing treatment and diffusion treatment.

TABLE 3

| | wt. % | | | | | | |
|---|---|---|---|---|---|---|---|
| | C | Si | Mn | P | S | sol. Al | N |
| steel sheet constituents | 0.002 | <0.1 | 0.01 | 0.003 | 0.0009 | 0.001 | 0.001 |

From the steel sheet thus produced a ring sample having 31 mm of outer diameter and 19 mm of inner diameter was taken and alternating current magnetic property at frequency of 5 kHz and magnetic flux density of 0.2 T was measured. The results are shown in FIG. 3. FIG. 3 is a graph showing Si concentration of surface layer on the horizontal axis and iron loss value of high frequency on the vertical axis. Since as shown in Table 1 Si concentration of the mother material is substantially 0, the horizontal axis of FIG. 1 shows substantially difference between Si concentration of steel sheet surface layer and Si concentration of sheet thickness center.

It has been confirmed from FIG. 3 that iron loss of high frequency of $W_{2/5\ k}$ is reduced by making the steel sheet have Si concentration gradient in steel thickness direction and by making Si concentration of steel sheet surface layer higher than Si concentration of steel sheet thickness center portion. In addition, it has been confirmed that by making Si amount of steel sheet surface layer 4 wt. % or more by far lower iron loss of high frequency is obtained and that, in particular, by making Si amount of steel sheet surface layer 6.5% remarkably low iron loss is obtained.

Furthermore, samples were subjected to chemical analysis, and whole of samples showed that Si concentration was 3.5 wt. % or less. In addition, magnetic property was measured by a direct current magnetization measurement apparatus, and whole of samples showed that saturation magnetic flux density was so high as to be 2.0 T or more.

Best Mode 3

The inventors of the present invention found that by means of defining magnetic permeability of strip surface to magnetic permeability of strip center portion within range of feature in respect of soft magnetic strip, loss of soft magnetic strip, in particular, loss of high frequency can be remarkably reduced.

Best mode 3 has been completed based on such knowledge. Firstly, the best mode 3 provides soft magnetic strip having low loss of high frequency which is characterized in that magnetic permeability of strip surface is two times as much as magnetic permeability of strip center portion or more.

Secondly, the best mode 3 provides the soft magnetic strip having low loss of high frequency which is characterized in that soft magnetic strip is silicon steel sheet having Si concentration gradient in thickness direction and magnetic permeability of strip surface is two times as much as magnetic permeability of strip center portion or more.

Thirdly, the best mode 3 provides the said soft magnetic strip which is characterized in that the said silicon steel sheet contains Si of 3.5% by weight or less in average of whole steel sheet thickness and the said soft magnetic strip has high saturation magnetic flux density and low loss of high frequency.

The soft magnetic strip according to the best mode is, as above described, magnetic permeability of strip surface is two times or more as much as magnetic permeability of strip center portion.

Figure 5:
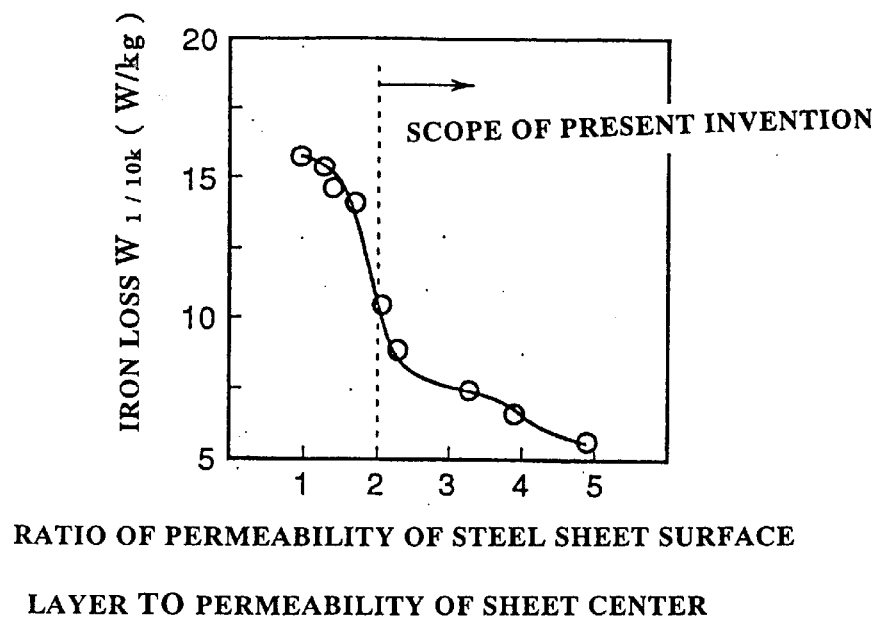
FIG. 5 is a view of showing, with respect to best mode 3, dependence of iron loss W 1/10 k with regard to ratio of permeability of a steel sheet surface layer to permeability of a steel sheet center in sheet thickness direction.

FIG. 5 is a graph showing relation between ratio of magnetic permeability of strip surface to magnetic permeability of strip center portion and high frequency loss $W_{1/10}$ $k$ (loss value at frequency of 10 kHz and flux density of 1 kGauss) in case of alloy strip of Fe—Si.

It is understood from FIG. 5 that loss is remarkably reduced if the ratio of magnetic permeability of strip surface to magnetic permeability of strip center portion is made to be 2 times or more. It is generally known that loss is low in case of soft magnetic material if magnetic permeability is high. There is, however, no example of paying attention to the ratio of magnetic permeability of strip surface and magnetic permeability of strip center portion as the present invention does. In this manner, by making magnetic permeability of strip surface two times as much as magnetic permeability of strip center portion or more, loss of homogeneous material of Si 6.5% by weight (Si content being 6.5% by weight throughout thickness) which has most excellent soft magnetic characteristic in case of alloy strip of Fe—Si can be reduced by 30% at maximum.

In this manner, the reason that the loss is more reduced by means of creating difference of magnetic permeability between strip surface portion and strip center portion than by means of strip having wholly homogeneous magnetic permeability is considered that by making strip surface layer have high magnetic permeability magnetic flux is concentrated in the surface portion, as the result, eddy current near strip center portion is reduced and thus resultantly skin effect is practically effectively stressed.

Therefore, the best mode 3 is not principally limited to material, thus it being not limited to the above described alloy strip of Fe—Si, the best mode 3 is applicable to soft magnetic material in general. The present invention is applicable so long as magnetic permeability of strip surface can be made to be 2 times as much as magnetic permeability of strip center portion or more. Method of forming such magnetic permeability distribution is not limited, and in case of alloy strip of Fe—Si by giving Si concentration gradient in thickness direction such magnetic permeability distribution can be formed. Furthermore, it is preferable that thickness of surface high magnetic permeability portion is 5% or more of sheet thickness. As examples of soft magnetic material to which the present invention is applicable, in addition to the above described alloy strip of Fe—Si, Fe—Al, Fe—Co, Fe—Ni, Permalloy and Sendust can be raised.

Figure 6:
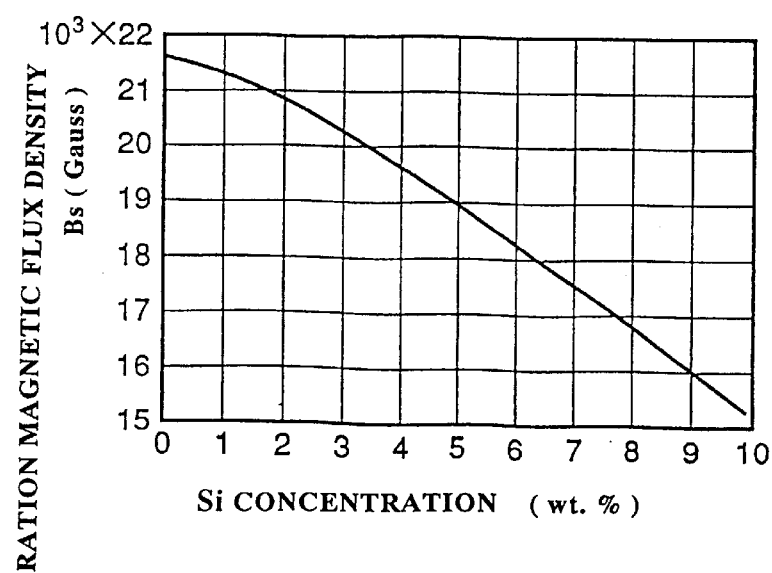
FIG. 6 is a view of showing, with respect to best mode 3, relation between Si amount of Fe—Si alloy and saturation magnetic flux density.

Furthermore, as shown in FIG. 6 (the source: R. M. Bozorth, Ferromangnetusm, van Nostrand, N.Y., 1951), the less Si amount is, the higher the saturation magnetic flux density is, and in particular, if Si content is 3.5% by weight or less, saturation magnetic flux density of 2.0 T(tesla) or more which is extremely high value is obtained. Therefore, according to the best mode 3, as terms and conditions that saturation magnetic flux density is made to especially be high, magnetic permeability of strip surface being made to be two times as much as magnetic permeability of strip center portion or more; having Si concentration gradient in thickness direction; and containing Si of 3.5% by weight or less are defined.

Average Si concentration which is said in the best mode 3 is obtained by chemical analysis. In addition, Si concentration gradient can be confirmed by analyzing cross section of sample by means of EPMA (an electron probe micro-analyzer). Various methods such as CVD and PVD can be employed without being limited in particular by method for forming high Si concentration gradient in sheet thickness direction.

In the best mode 3, when as soft magnetic strip alloy strip of Fe—Si, in other words, silicon steel sheet is used, constituents other than Si are not especially limited, and they are satisfactory so long as they are in a usual range of steel sheet of this kind. That is to say, it is preferable that they are in a range of C≦0.2 wt. %, 0.05 wt. %≦Mn≦0.5 wt. %, P≦0.01 wt. %, S≦0.02 wt. %, 0.001 wt. %≦sol. Al≦0.06 wt. % and N≦0.01 wt. %.

EXAMPLE

Steel sheet having constituents shown in Table 4 with thickness 0.1 mm was produced by rolling method, was subjected to silicon immersion treatment in atmosphere of $SiCl_4$ at 1200° C. and thereafter was subjected to diffusion treatment in atmosphere of $N_2$ at 1200° C. to produce silicon steel sheet having various Si concentration distributions. The Si concentration distributions were analyzed by EPMA (an electron probe micro-analyzer) with regard to cross section of sample. Elements other than Si hardly changed before and after silicon immersion treatment and diffusion treatment.

TABLE 4

| | wt. % | | | | | | |
|---|---|---|---|---|---|---|---|
| | C | Si | Mn | P | S | sol.Al | N |
| steel sheet constituents | 0.003 | 3.0 | 0.01 | 0.003 | 0.0003 | 0.001 | 0.002 |

Figure 7:
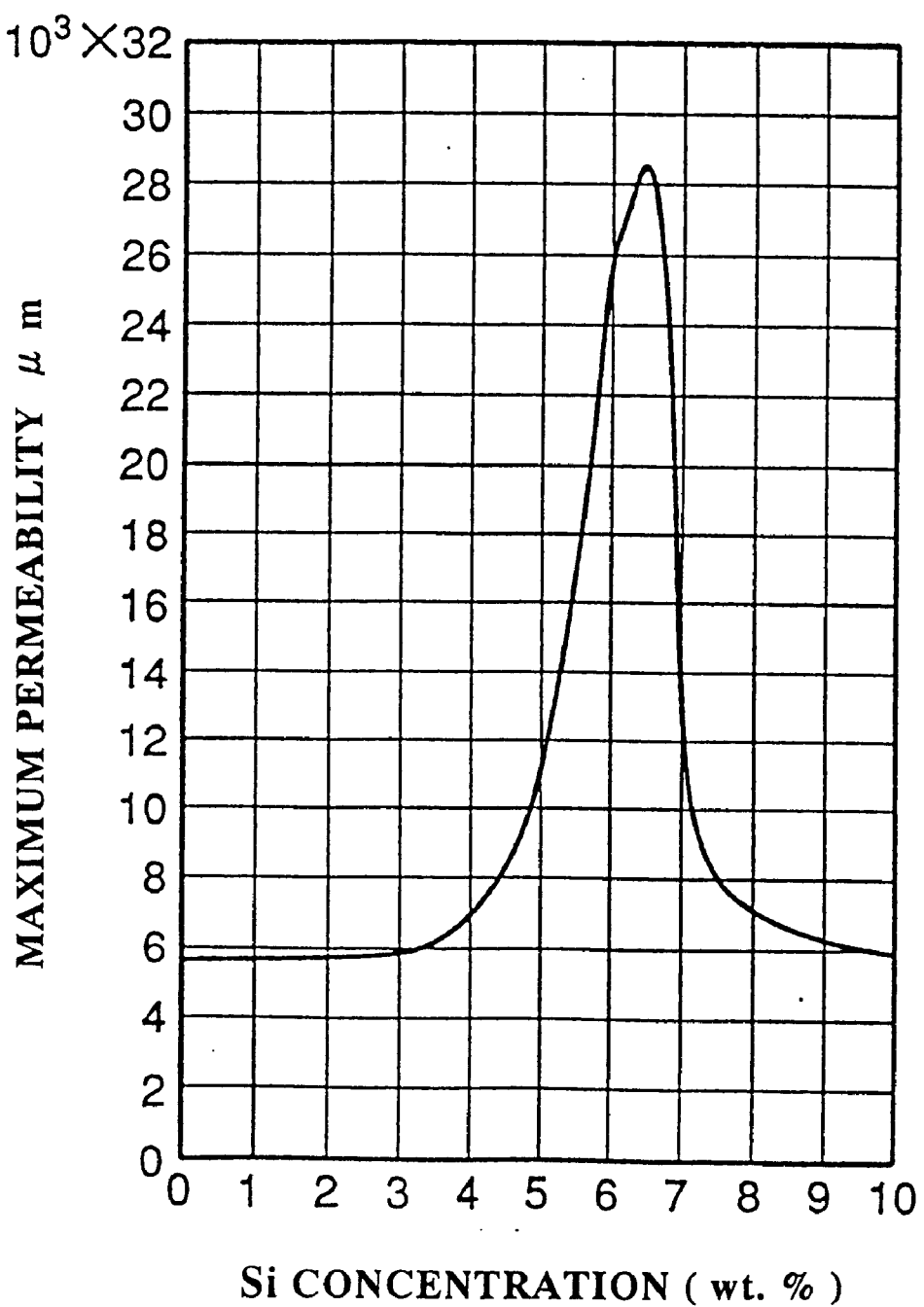
FIG. 7 is a view of showing, with respect to best mode 3, relation between Si amount of Fe—Si alloy and maximum permeability.

From the steel sheet thus produced a ring sample having 31 mm of outer diameter and 19 mm of inner diameter was taken and alternating current magnetic characteristic at frequency of 10 kHz and magnetic flux density of 0.1 T was measured. FIG. 5 is a graph showing dependency of iron loss $W_{1/10\ k}$ on ratio of magnetic permeability of strip surface to magnetic permeability of strip center portion. Provided, however, that magnetic permeability of strip surface and magnetic permeability of strip center portion were obtained from Si measured by EPMA using FIG. 7 (the source: R. M. Bozorth, Ferromangnetusm, van Nostrand, N.Y., 1951).

As shown in FIG. 5, it has been confirmed that high frequency loss is remarkably reduced if magnetic permeability of strip surface is made to be two times as much as magnetic permeability of strip center portion or more.

Best Mode 4

The inventors of the present invention found that by means of defining Si concentration of a steel sheet surface layer and a sheet depth of sheet thickness direction in a domain which has the Si concentration within a special range in respect of the silicon steel sheet, iron loss of the silicon steel sheet, in particular, iron loss of high frequency can be remarkably reduced.

Best mode 4 has been completed based on such knowledge. Firstly, the best mode 4 provides a silicon steel sheet having low iron loss of high frequency which is characterized in that the silicon steel sheet comprising 0.02 wt. % or less C, 0.05–0.5 wt. % Mn, 0.01 wt. % or less P, 0.02 wt. % or less S, 0.001–0.06 wt. % sol. Al and 0.01 wt. % or less N; portion of Si concentration of 5 to 8 wt. % is 10% or more of sheet thickness in thickness direction from both an upper surface layer and a lower surface layer of the steel sheet; and Si concentration in the vicinity of sheet thickness center is 2.2 to 3.5 wt. %.

Secondly, the best mode 4 provides a silicon steel sheet having low iron low loss of high frequency as defined above, characterized in that the portion of Si concentration of 5 to 8 wt. % is substantially 15 to 25% of sheet thickness in thickness direction from both an upper surface layer and a lower surface layer of the steel sheet.

Thirdly, the best mode 4 provides a silicon steel sheet having low iron loss of high frequency as defined firstly above which is characterized in that the portion of Si concentration of substantially 6.5 wt. % is 10% or more of sheet thickness in thickness direction from both an upper surface layer and a lower surface layer of the steel sheet.

Fourthly, the best mode 4 provides a silicon steel sheet having low iron low loss of high frequency as defined thirdly above which is characterized in that the portion of Si concentration of substantially 6.5 wt. % is 15 to 25% of sheet thickness in thickness direction from both an upper surface layer and a lower surface layer of the steel sheet.

Now Best mode 4 will be described in detail.

The silicon steel sheet according to the best mode 4 is, as above described, portion of Si concentration of 5 to 8 wt. % is 10% or more of sheet thickness in thickness direction from both an upper surface layer and a lower surface layer of the steel sheet; and Si concentration in the vicinity of sheet thickness center is 2 to 3.5 wt. %.

Figure 8:
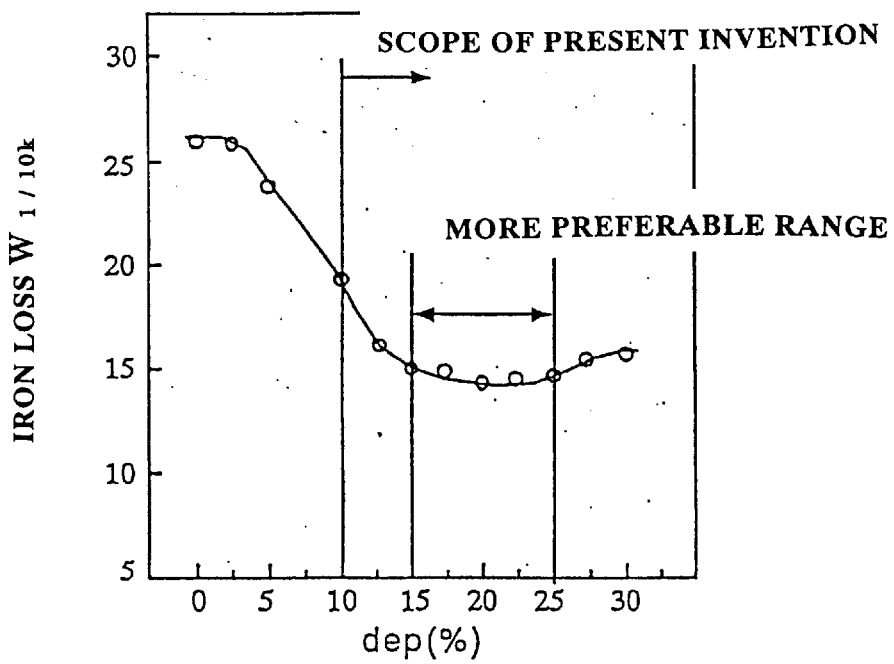
FIG. 8 is a view of showing relation between dep (%) of depth ratio of a portion having Si concentration of 5% or more from a surface layer and iron loss W 1/10 k in case that Si concentration distribution is formed in sheet thickness direction in respect of best mode 4.
Figure 9:
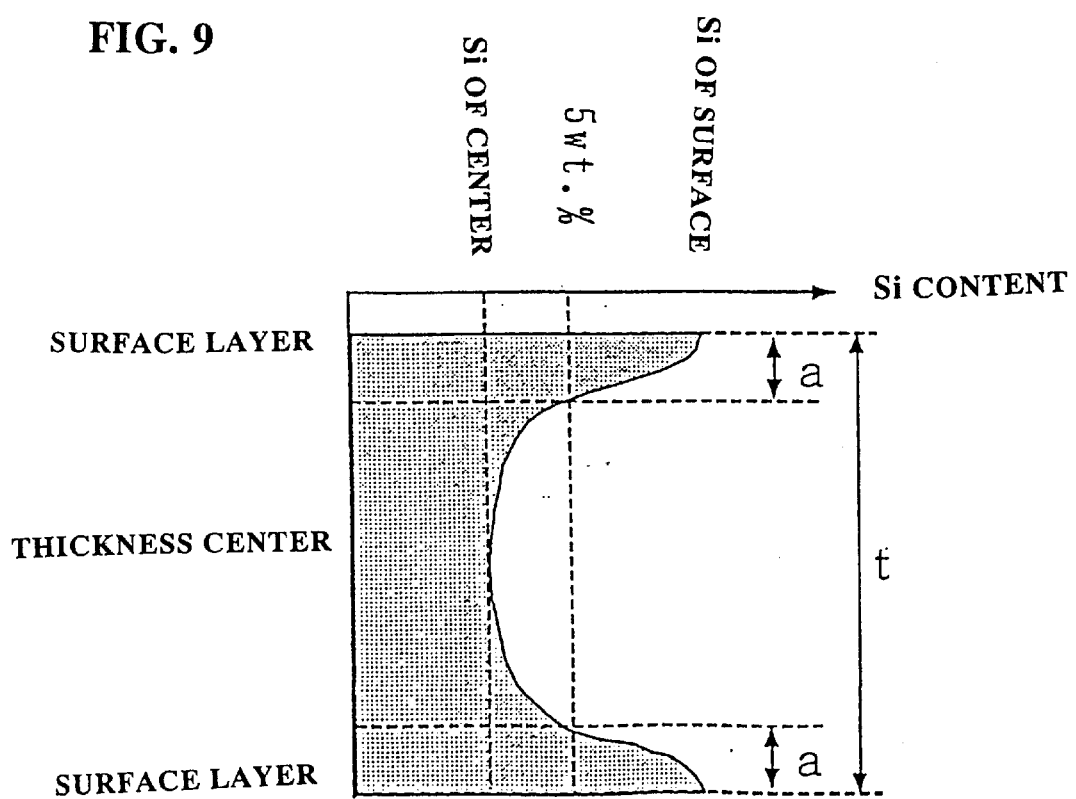
FIG. 9 is a view of explaining about definition of the dep (%) of depth ratio of FIG. 8.

FIG. 8 is a graph showing relation between ratio of depth dep(%) of portion of Si concentration of 5 wt. % or more from a surface layer and iron loss $W_{1/10\ k}$ (iron loss value at frequency of 10 kHz and at magnetic flux density of 1 kGauss) in case that Si concentration distribution is formed in thickness direction. Provided, however, that here as shown in FIG. 9, when depth is made to be a and sheet thickness to be t where Si concentration becomes 5 wt. %, ratio of depth of the portion of Si concentration of 5 wt. % or more from a surface layer is defined as dep(%)=(a/t)×100.

It should be noted that Si concentration is result of analysis by EPMA (an electron probe micro-analyzer) with a cross section of a sample. In addition, here a Si steel sheet of 3 wt. % which was produced by rolling method of sheet thickness of 0.2 mm was subjected to siliconizing treatment in atmosphere of $SiCl_4$ at 1200° C. and thereafter subjected to diffusion treatment in atmosphere of $N_2$ at 1200° C. using samples which formed various Si concentrations distribution.

It is understood from FIG. 8 that iron loss is remarkably reduced if the ratio of depth of portion of Si concentration of 5 wt. % or more from a surface layer is made to be 10% or more, and more preferably to be 15 to 25%. At this moment, the iron loss is reduced by about 30% at maximum compared with Si of 6.5% silicon steel sheet. The upper limit of Si concentration of high Si concentration portion of a surface layer of the steel sheet is not especially defined from view point of iron loss property. Since, however, formability of the steel sheet is deteriorated if Si concentration is over 8 wt. %, the upper limit was defined to be 8 wt. %.

When it has transformation point in view of phase diagram, owing to passing through transformation point by means of heat treatment granulation is invited, and magnetic property is remarkably damaged. For this reason, since it is necessary to be a single α phase in view of phase diagram, the lower limit value of Si concentration of low Si portion in thickness center portion was defined to be 2.2 wt. %.

Material which has, in this manner, high Si concentration of a surface layer and low Si concentration of thickness center portion is disclosed in Japanese patent No. 2541383, Japanese unexamined patent publication No. 6-17202 and Japanese unexamined patent publication No. 9-184051. The Japanese patent No. 2541383, however, proposes a silicon steel sheet of high Si concentration of a surface layer which is obtained as the result of shortening time for diffusion treatment so as to improve productivity when a silicon steel sheet of 6.5 wt. % is produced, the iron loss is equal to that of the silicon steel sheet of 6.5 wt. %. In addition, the Japanese unexamined patent publication No. 6-17202 discloses a silicon steel sheet of 6.5 wt. % of only surface so as to improve formability of a silicon steel sheet of 6.5 wt. %, the iron loss is deteriorated compared with the silicon steel sheet of 6.5 wt. %. Still furthermore, the Japanese unexamined patent publication No. 9-184051 proposes a high Si steel sheet of surface so as to reduce residual magnetic flux density, which is different from the object of the present invention. So far as the iron loss is concerned, in case of iron loss of 50 Hz material of high Si of a surface layer is low. If frequency, however, becomes high, iron loss is usually considered to generally be controlled by total Si amount and so far as material of low Si amount in thickness center portion is concerned, iron loss property is considered to be inferior.

The best mode 4 upsets such common sense and has been made on based on knowledge firstly found that material which has low iron loss of high frequency can be obtained by forming a certain Si concentration distribution.

Method of forming high Si concentration portion of steel sheet surface can be any method of CVD, PVD and others, and is not especially limited. Mother material before formation of Si concentration distribution is preferably produced by rolling method suitable for mass production. For this reason, it is preferable that Si content of the mother material is made to be 3.5 wt. % at the upper limit. Therefore, the upper limit value of Si concentration of low Si portion of sheet thickness center portion in the silicon steel sheet of the present invention was defined to be 3.5 wt. %.

Figure 10:
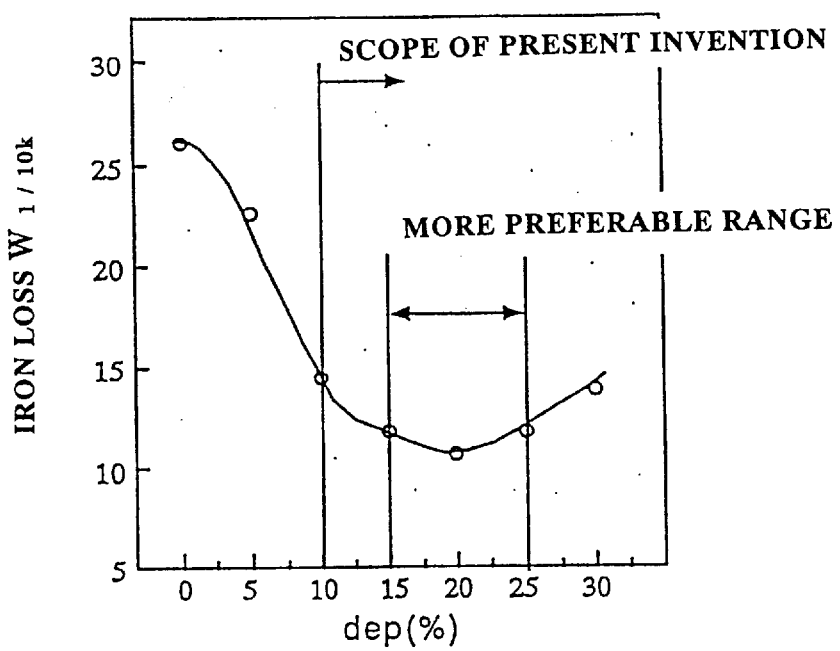
FIG. 10 is a view of showing relation between depth ratio (%) of a portion having Si concentration of substantially 6.5% from a surface layer and iron loss W 1/10 k in case that Si concentration distribution is formed in sheet thickness direction in respect of best mode 4.
Figure 11:
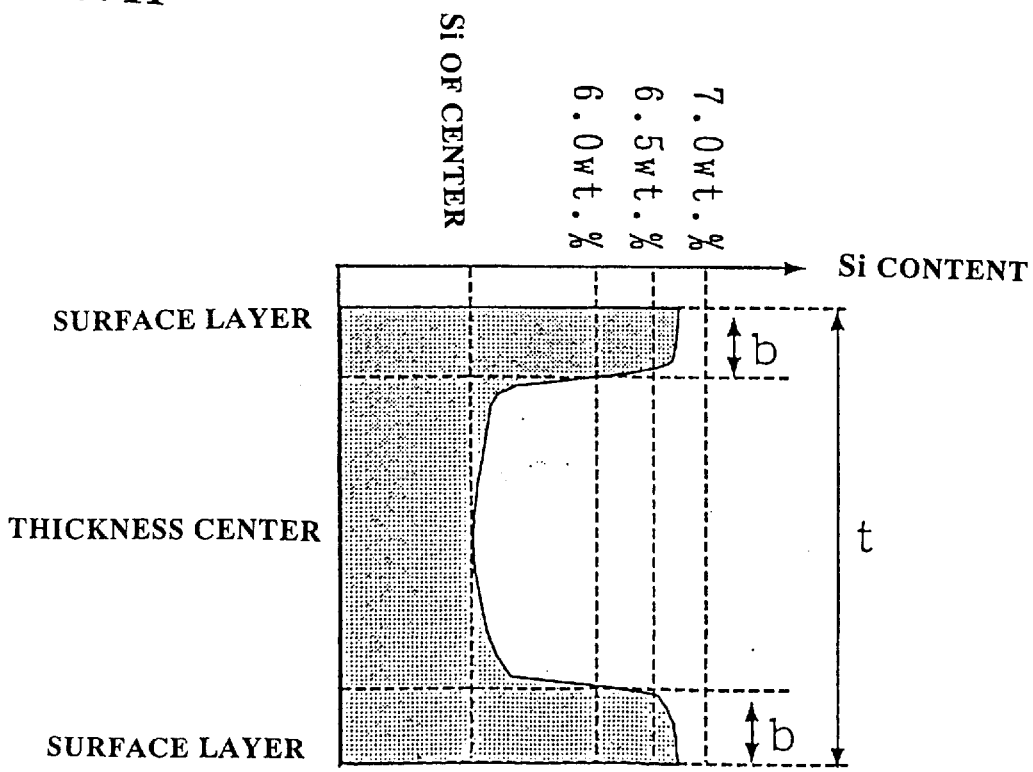
FIG. 11 is a view of explaining about definition of the dep (%) of depth ratio of FIG. 10.

FIG. 10 is a graph showing relation between depth ratio (%) of portion of Si concentration of substantially 6.5 wt. % from a surface layer and iron loss $W_{1/10\ k}$ in case that Si concentration distribution is formed in thickness direction. Provided, however, that here as shown in FIG. 11, when depth is made to be b and sheet thickness to be t where Si concentration becomes 6 to 7 wt. %, ratio of depth of the portion of Si concentration of substantially 6.5% or more from a surface layer is defined as dep(%)=(b/t)×100.

In addition, here a Si steel sheet of 3 wt. % which was produced by rolling method of sheet thickness of 0.2 mm was subjected to siliconizing treatment in atmosphere of SiCl$_4$ at 1150° C. and thereafter subjected to diffusion treatment in atmosphere of N$_2$ at 1150° C. using samples which formed various Si concentrations distribution.

It is understood from FIG. 10 that iron loss is remarkably reduced if the ratio of depth of Si concentration of substantially 6.5 wt. % from a surface layer is made to be 10% or more, and more preferably to be 15 to 25%. Furthermore, if FIG. 8 and FIG. 10 are compared, it is understood that iron loss can be by far more reduced by defining concentration of high Si portion of a surface layer to be substantially 6.5 wt. %.

Effect of the best mode 4 is not dependent on sheet thickness of a silicon steel sheet, and even if it is any of sheet thickness, by defining it to be within a range which the present invention defines, iron loss can be remarkably reduced.

Now reason for restricting elements other than Si will be described.

C: When C is contained much, that will brings about magnetic aging. For this reason, the upper limit is defined to be 0.02 wt. %. The lower limit is not especially defined. From economically removal point of view, however, the lower limit is preferably defined to be 0.01 wt. %.

Mn: When Mn is contained much, a steel sheet becomes brittle. Therefore, the upper limit is defined to be 0.5 wt. %. When, however, the content is too low, fracture and surface defect during hot rolling process is invited. Therefore, the lower limit is defined to be 0.05 wt. %.

P: P is a preferable element from magnetic property point of view. If it, however, is contained much, that deteriorates formability of a steel sheet. For this reason, the upper limit is defined to be 0.01 wt. %. The lower limit is not especially defined, but from economical removal point of view it is preferably defined to be 0.001 wt. %.

S: Since S deteriorates formability, it is necessary that the upper limit is determined to be 0.02 wt. %. The lower limit is not especially defined, but from economical removal point of view it is preferably defined to be 0.001 wt. %.

sol. Al: Since sol. Al deteriorates formability similarly, the upper limit is defined to be 0.06 wt. %. On the other hand, because of necessity of sol. Al being as deoxidizer the lower limit is defined to be 0.001 wt. %.

N: If N is contained much, nitride is formed so that magnetic property is deteriorated. For this reason, it is necessary that the upper limit is determined to be 0.01 wt. %. The lower limit is not especially defined, but according to the present steel-making technology it is determined to be 0.0001 wt. % in fact.

EXAMPLE

Example 1

A steel sheet having constituents shown in Table 5 with thickness of 0.2 mm was produced by method of rolling, subjected to siliconizing treatment in atmosphere of SiCl$_4$ at 1200° C. and thereafter subjected to diffusion treatment in atmosphere of N$_2$ at 1200° C. to produce a silicon steel sheet having various Si concentration distributions. Si concentration distributions were analyzed by EPMA (an electron probe micro-analyzer) with regard to cross section of a sample. Elements other than Si hardly changed before and after siliconizing treatment and diffusion treatment.

TABLE 5

| | wt. % | | | | | | |
|---|---|---|---|---|---|---|---|
| | C | Si | Mn | P | S | sol. Al | N |
| steel sheet constituents | 0.003 | 3.0 | 0.01 | 1.003 | 0.0003 | 0.001 | 0.002 |

From the steel sheet thus produced a ring sample having 31 mm of outer diameter and 19 mm of inner diameter was taken and alternating current magnetic property at frequency of 10 kHz and magnetic flux density of 0.1 T was measured. FIG. 8 is a graph showing ratio of depth dep(%) of portion of Si concentration of 5 wt. % or more from a surface layer and iron loss W$_{1/10\,k}$. Provided, however, that here as shown in FIG. 9, when depth is made to be a and sheet thickness to be t where Si concentration becomes 5 wt. %, ratio of depth of the portion of Si concentration of 5 wt. % or more from a surface layer is defined as dep(%)=(a/t)×100.

It has been confirmed from FIG. 8 that iron loss is remarkably reduced if ratio of depth of the portion of Si concentration of 5 wt. % from a surface layer is made to be 10% or more, and more preferably 15 to 25%.

Example 2

A steel sheet having constituents shown in Table 5 with thickness of 0.2 mm was produced by method of rolling, subjected to siliconizing treatment in atmosphere of SiCl$_4$ at 1150° C. and thereafter subjected to diffusion treatment in atmosphere of N$_2$ at 1150° C. to produce a silicon steel sheet having various Si concentration distributions. Si concentration distributions were analyzed by EPMA with regard to cross section of a sample. Elements other than Si hardly changed before and after siliconizing treatment and diffusion treatment.

From the steel sheet thus produced a ring sample having 31 mm of outer diameter and 19 mm of inner diameter was taken and alternating current magnetic property at frequency of 10 kHz and magnetic flux density of 0.1 T was measured. FIG. 10 is a graph showing ratio of depth dep(%) of portion of Si concentration of substantially 6.5 wt. % from a surface layer and iron loss W$_{1/10\,k}$. Provided, however, that here as shown in FIG. 11, when depth is made to be b and sheet thickness to be t where Si concentration becomes 6.0 to 7.0 wt. %, ratio of depth of the portion of Si concentration of substantially 6.5 wt. % from a surface layer is defined as dep(%)=(b/t)×100.

It has been confirmed from FIG. 10 that iron loss is remarkably reduced if ratio of depth of the portion of Si concentration of substantially 6.5 wt. % from a surface layer is made to be 10% or more, and more preferably 15 to 25%.

Furthermore, if FIG. 8 and FIG. 10 are compared, it is understood that iron loss can be by far more reduced by defining concentration of high Si portion of a surface layer to be substantially 6.5 wt. %.

Best Mode 5

The inventors of the present invention have studied causes for there being a case that iron loss of high frequency is not reduced in a silicon steel sheet which has formed Si concentration gradient in this manner. As the results, they have found that even if Si concentration distribution in which Si concentration of surface layer is high and Si concentration of sheet thickness center portion is low is formed, iron loss of high frequency is not reduced if difference between Si concentration of front surface and Si concentration of back surface is large.

The reason that such difference between Si concentration of front surface and Si concentration of back surface is produced is considered that supply amount of Si compound gas onto front surface and supply amount of Si compound gas onto back surface is different owing to dispersion of terms and conditions of production when Si compound is subjected to siliconizing treatment.

In order that such difference between Si concentration of front surface and Si concentration of back surface is suppressed, it has been found that curl of a steel sheet which is caused by difference between Si concentration of front surface and Si concentration of back surface is measured and that it is effective to control amount of Si compound which is supplied to front surface and back surface so that amount of the curl falls in a certain narrow range.

The best mode 5 has been made based on such knowledge. It provides a high silicon steel sheet excellent in magnetic property of high frequency which is characterized in that the silicon steel sheet has Si concentration gradient in sheet thickness direction; Si concentration of surface is higher than Si concentration of sheet thickness center portion; difference between maximum Si concentration and minimum Si concentration in sheet thickness direction is 0.3 wt. % or more; Si concentration of surface layer is 5 to 8 wt. %; and difference between Si concentration of front surface and Si concentration of back surface is within 1 wt. %

The best mode 5 provides a method for producing a high silicon steel sheet excellent in magnetic property of high frequency which is characterized in that siliconizing treatment making Si penetrate through steel sheet surface and diffusing treatment making Si diffuse in a steel sheet are simultaneously carried out at non-oxidizing atmosphere which includes Si compound to control siliconizing rate and diffusing rate; the siliconizing treatment and the diffusing treatment are stopped while state in which Si concentration of surface layer is higher than Si concentration of sheet thickness center portion is kept; difference between maximum Si concentration and minimum Si concentration in sheet thickness direction is made to be 0.3 wt. % or more; Si concentration of surface layer is made to be 5 to 8 wt. %; and difference between Si concentration of front surface and Si concentration of back surface is made to be within 1 wt. %.

Furthermore, the best mode 5 provides a method for producing a high silicon steel sheet excellent in magnetic property of high frequency which is characterized in that a steel sheet is subjected to siliconizing treatment at non-oxidizing gas atmosphere which includes Si compound; subsequently the steel sheet is subjected to diffusing treatment at non-oxidizing gas atmosphere which does not include Si compound to control Si diffusing rate; the diffusing treatment is stopped while state in which Si concentration of surface layer is higher than Si concentration of sheet thickness center portion is kept; difference between maximum Si concentration and minimum Si concentration in sheet thickness direction is made to be 0.3 wt. % or more; Si concentration of surface layer is made to be 5 to 8 wt. %; and difference between Si concentration of front surface and Si concentration of back surface is made to be within 1 wt. %.

Still furthermore, the best mode 5 provides a method for producing a high silicon steel sheet excellent in magnetic property of high frequency of either of the methods defined above which is characterized in that height of curl of a steel sheet is measured at an exit of a furnace in order that difference between Si concentration of front surface and Si concentration of back surface is made to be within 1 wt. %; and amount of Si compound which is supplied to front surface and back surface of the steel sheet is controlled so that the height of the curl is made to be 1% or less of product depth.

It is preferable that as the above described Si compound $SiCl_4$ is used.

Now the best mode 5 will be described in detail.

According to the best mode 5, the silicon steel sheet has Si concentration gradient in sheet thickness direction; Si concentration of surface is higher than Si concentration of sheet thickness center portion; difference between maximum Si concentration and minimum Si concentration in sheet thickness direction is made to be 0.3 wt. % or more; and difference between Si concentration of front surface and Si concentration of back surface is made to be within 1 wt. % in a high silicon steel sheet having Si concentration of surface layer of 5 to 8 wt. %.

In order to reduce iron loss at high frequency of 5 kHz or more, it is effective that magnetic permeability exclusively in the vicinity of steel sheet surface layer is made to be high, and that apparent sheet thickness is made to be thin by concentrating magnetic flux on there. For the purpose, in the present invention Si concentration of surface layer is made to be high and Si concentration of sheet thickness portion is made to be low to form Si concentration gradient in sheet thickness direction, and magnetic permeability is made to be high exclusively at sheet surface layer portion.

It, however, has been found that iron loss of high frequency is not reduced in case that difference between Si concentration of front surface and Si concentration of back surface is large. Therefore, in the present invention, difference between Si concentration of front surface and Si concentration of back surface is defined to be within 1%. In this manner by defining difference between Si concentration of front surface and Si concentration of back surface to be within 1%, stably low iron loss of high frequency is obtained. Reason that iron loss becomes low in this manner in case that difference between Si concentration of front surface and Si concentration of back surface is small is inferred to be because of stable formation of high magnetic permeability region of front surface and back surface and reduction of inner strain due to good shape.

Si concentration of surface layer is defined to be in range of 5 to 8 wt. %. This is because effect that magnetic permeability in the vicinity of the above described steel sheet is made to be high is low in case that Si concentration of surface layer is less 5 wt. % and in case that Si concentration of surface layer is over 8 wt. %. Si concentration of surface layer is more preferably in range of 6 to 7 wt. %.

In addition, Si concentration gradient in sheet thickness direction is formed so that difference between maximum Si concentration and minimum Si concentration in sheet thickness direction is 0.3 wt. % or more, and thereby effect of concentrating magnetic flux on surface layer can be displayed and iron loss of high frequency can be effectively reduced.

A silicon steel sheet having Si concentration gradient according to the present invention can be produced, for example, by chemical vapor deposition (CVD, siliconizing treatment) method, physical vapor deposition (PVD), clad technology and plating technology. Among these described above, however, production by CVD is preferable.

According to CVD method, a steel sheet is subjected to siliconizing treatment at non-oxidizing gas atmosphere which includes Si compound, subsequently the steel sheet is subjected to diffusing treatment at non-oxidizing gas atmosphere which does not include Si compound to control Si diffusing rate, and the diffusing treatment is stopped while state in which Si concentration of surface layer is higher than Si concentration of sheet thickness center portion is kept. Thereby the above described Si concentration distribution can be formed.

In addition, siliconizing treatment making Si penetrate through steel sheet surface and diffusing treatment making Si diffuse in a steel sheet are simultaneously carried out at non-oxidizing atmosphere which includes Si compound to control siliconizing rate and diffusing rate, the siliconizing treatment and the diffusing treatment are stopped while state in which Si concentration of surface layer is higher than Si concentration of sheet thickness center portion is kept. Thereby the above described Si concentration distribution can also be formed.

According to the latter method, by carrying out the siliconizing treatment and the diffusing treatment simultaneously at the same atmosphere not only construction of a furnace can be simplified but also steel sheet oxidization which has been conventionally a problem of a diffusing furnace can be suppressed. In addition, by means of atmosphere adjustment in a siliconizing treatment furnace and a diffusing treatment furnace, and by means of adjustment of a place to which $SiCl_4$ gas is introduced, flow amount of $SiCl_4$ gas and moving rate of a steel sheet, controlling Si concentration distribution can be made to be easy and extremely high free treatment can be carried out.

Siliconizing treatment is carried out using Si compound gas. The Si compound gas which is used for the treatment is not especially limited, such as $SiH_4$, $Si_2H_5$ and $SiCl_4$ can be used and among them, $SiCl_4$ is preferable. In case that as treatment gas, $SiCl_4$ is used, it is preferable that treatment temperature is in range of 1023 to 1250° C. In addition, concentration of $SiCl_4$ during siliconizing treatment and diffusing treatment is preferably made to be 0.02 to 35 mol %.

Si compound gas is usually supplied from front surface side and back surface side of a steel sheet. By controlling supply amount of this gas, however, difference between Si concentration of front surface and Si concentration of back surface can be made to be within 1%.

However, since it is difficult to measure the difference between the Si concentration of the front surface and the Si concentration of the back surface in practical operation in real time, the height of the curl (C curl) of a steel sheet in the width direction is measured at an exit of a furnace, and it is preferable to control the amount of the Si compound which is supplied from the front surface and the back surface of a steel sheet so that the height of the curl may be 1% or less of the product width. In other words, there is a relationship that the larger the difference between the Si concentration of the front surface and the Si concentration of the back surface is, the larger the curl of the steel sheet is, and if the height of this curl is 1% or less, the difference between the Si concentration of the front surface and the Si concentration of the back surface is 1% or less. Therefore, the height of the curl is measured at an exit of a furnace, and by controlling the through feed back amount of the Si compound which is supplied from the front surface and the back surface so that this height is 1% or less of the product width, the difference between the Si concentration of the front surface and the Si concentration of the back surface can be made to be within 1%.

In the best mode 5, constituents other than Si are not especially limited and would be satisfactory in usual range of a steel sheet of this kind. Namely they preferably comprises 0.02 wt. % or less C, 0.05–0.5 wt. % Mn, 0.01 wt. % or less P, 0.02 wt. % or less S, 0.001–0.06 wt. % sol. Al and 0.01 wt. % or less N.

When C is contained much, that brings about magnetic aging. The upper limit is preferably defined to be 0.02 wt. %. The lower limit is not especially defined from the property point of view. From economically removing point of view, the lower limit is preferably defined to be 0.001 wt. %.

When Mn is contained much a steel sheet becomes brittle. Therefore, the upper limit is preferably defined to be 0.5 wt. %. In addition, if the content is too low, fracture and surface defect during hot rolling process are invited. Therefore, the lower limit is preferably defined to be 0.05 wt. %.

P is a preferable element from magnetic property point of view. If it, however, is contained much, that deteriorates formability of a steel sheet. For this reason, the upper limit is defined to be 0.01 wt. %. The lower limit is not especially defined from the property point of view, but from economically removing point of view the lower limit is preferably defined to be 0.001 wt. %.

Since S deteriorates formability, it is preferable that the upper limit is determined to be 0.02 wt. %. The lower limit is not especially defined from the property point of view, but from economically removing point of view the lower limit is preferably defined to be 0.001 wt. %.

Since sol. Al deteriorates formability similarly, the upper limit is preferably defined to be 0.06 wt. %. On the other hand, because of necessity of sol. Al being as deoxidizer the lower limit is preferably defined to be 0.001 wt. %.

If N is contained much, nitride is formed so that magnetic property is deteriorated. For this reason, the upper limit is preferably determined to be 0.01 wt. %. The lower limit is not especially defined from the property point of view, but according to the present steel-making technology the lower limit is determined to be 0.0001 wt. % in fact.

Si concentration of front surface and Si concentration of back surface and difference between maximum of Si concentration and minimum of Si concentration can be determined from Si concentration profile which is obtained by analyzing whole sheet thickness through EPMA analysis. Effect of the present invention can be obtained without being dependent on thickness of a steel sheet.

EXAMPLE

Now examples of the present invention will be described below.

Example 1

A silicon steel sheet having 0.3 mm of sheet thickness and 640 mm of width with 3 wt. % was subjected to siliconizing treatment of various terms and conditions, and a high silicon steel sheet having Si concentration of 0.3% or more in sheet thickness direction was produced on experimental basis. Then, correlation between Si concentration of front surface and Si concentration of back surface and iron loss value was investigated.

Temperature of a siliconizing treatment furnace was set to be 1200° C. and soaking temperatures were set to be 1150° C., 1000° C. and 900° C. in divided three zones. Under conditions that line speed was constant at 10 mpm, flow rate of $SiCl_4$ which was supplied respectively to front surface and back surface was varied and Si value of front surface and back surface of a steel sheet was varied, iron loss was measured. In Table 6, Si concentrations of front surface and back surface, difference between Si concentrations of front surface and back surface, average difference of Si concentration ($\Delta Si$) and iron loss value (Epstein measurement value) are shown. In addition, height of C curl of a steel sheet is shown together. Any of Si concentration of sheet thickness center portion was 3 wt. %. Average ΔSi is value computed by the following formula.

Average ΔSi=(front surface Si+back surface Si)/2−sheet center Si

As shown in Table 6, those which satisfy the present invention obtained low iron loss in response to Si concentration of surface layer. Those which have Si concentration of 6.5 wt. % obtained low iron loss compared with those of uniform 6.5 wt. % Si. In contrast to this, it has been confirmed that those which have gotten out of Si concentration of surface layer and those which have difference of 1 wt. % or more between Si concentrations of front surface and back surface show that iron loss is high. It has been confirmed that those which have difference of within 1 wt. % between Si concentration of front surface and Si concentration of back surface show height of C curl is 1% or less of steel sheet width.

Example 2

A silicon steel sheet having 0.1 mm of sheet thickness and 640 mm of width with 3 wt. % was subjected to siliconizing treatment of various terms and conditions, and a high silicon steel sheet having Si concentration of 0.3% or more in sheet thickness direction was produced on experimental basis. Then, correlation between Si concentration of front surface and Si concentration of back surface and iron loss value was investigated.

Temperature of a siliconizing was set to be 1200° C. and soaking temperatures were set to be 1100° C., 950° C. and 800° C. in divided three zones. Under conditions that line speed was constant at 20 mpm, flow rate of $SiCl_4$ which was supplied respectively to front surface and back surface was varied and Si value of front surface and back surface of a steel sheet was varied, iron loss was measured. In Table 7, Si concentrations of front surface and back surface, difference between Si concentrations of front surface and back surface, average difference of Si concentration (ΔSi) and iron loss value (Epstein measurement value) are shown. In addition, height of C curl of a steel sheet is shown together. Any of Si concentration of sheet thickness center portion was 3 to 5 wt. %.

As shown in Table 7, those which satisfy the present invention obtained low iron loss in response to Si concentration of surface layer. Those which have Si concentration of 6.5 wt. % obtained low iron loss compared with those of uniform 6.5 wt. % Si. In contrast to this, it has been confirmed that those which have gotten out of Si concentration of surface layer and those which have difference of 1 wt. % or more between Si concentrations of front surface and back surface show that iron loss is high. It has been confirmed that those which have difference of within 1 wt. % between Si concentration of front surface and Si concentration of back surface show height of C curl is 1% or less of steel sheet width.

TABLE 6

| No | Si concentration of surface layer (wt. %) (fluorescence X rays) front | Si concentration of surface layer (wt. %) (fluorescence X rays) back | Difference between Si concentrations of front surface% Si concentration of back surface (wt. %) | Average ΔSi (wt. %) | Epstein meaurement value $W_{1/4k}$ (W/kg) | C curl (mm) | Remarks |
|---|---|---|---|---|---|---|---|
| 1 | 4.3 | 4.5 | 0.2 | 1.4 | 27.8 | 1 | |
| 2 | 5.8 | 5.7 | 0.1 | 2.4 | 22.7 | 2 | Present invention |
| 3 | 6.6 | 6.4 | 0.2 | 3.5 | 19.1 | 2 | Present invention |
| 4 | 7.3 | 6.9 | 0.4 | 4.1 | 25.4 | 3 | |
| 5 | 6.1 | 6.9 | 0.8 | 3.5 | 21.4 | 5 | Present invention |
| 6 | 5.9 | 7.1 | 1.2 | 3.5 | 24.4 | 8 | |
| 7 | 5.5 | 6.6 | 1.1 | 3.1 | 24.8 | 7 | |
| 8 | Uniform 6.5 wt. % Si | | 0 | 0 | 20.8 | 1 | |

TABLE 7

| No | Si concentration of surface layer (wt. %) (fluorescence X rays) front | Si concentration of surface layer (wt. %) (fluorescence X rays) back | Difference between Si concentration of front surface& Si concentration of back surface (wt. %) | Average ΔSi (wt. %) | Epstein meaurement $W_{1/4k}$ (W/kg) | C curl (mm) | Remarks |
|---|---|---|---|---|---|---|---|
| 9 | 3.9 | 4.3 | 0.4 | 1.1 | 9.6 | 2 | |
| 10 | 5.6 | 5.8 | 0.2 | 1.5 | 8.4 | 1 | Present invention |
| 11 | 6.3 | 6.4 | 0.1 | 2.5 | 7.1 | 1 | Present invention |

TABLE 7-continued

| No | Si concentration of surface layer (wt. %) (fluorescence X rays) front | back | Difference between Si concentration of front surface & Si concentration of back surface (wt. %) | Average Δ Si (wt. %) | Epstein meaurement $W_{1/1\text{-}1k}$ (W/kg) | C curl (mm) | Remarks |
|---|---|---|---|---|---|---|---|
| 12 | 7.3 | 6.9 | 0.4 | 2.8 | 8.6 | 3 | |
| 13 | 6.0 | 6.9 | 0.9 | 2.4 | 7.6 | 5 | Present invention |
| 14 | 6.5 | 7.2 | 0.2 | 2.5 | 6.6 | 1 | Present invention |
| 15 | 5.9 | 6.7 | 1.3 | 2.1 | 9.1 | 7 | |
| 16 | 5.3 | 6.7 | 1.4 | 1.9 | 8.7 | 7 | |
| 17 | Uniform 6.5 wt. % Si | | 0 | 0 | 8.3 | 1 | |

Best Mode 6

The inventors of the present invention found that by forming Si concentration distribution in sheet thickness direction in a grain oriented silicon steel sheet, iron loss of a grain oriented silicon steel sheet, in particular, iron loss of high frequency can be remarkably reduced. That is to say, by forming Si concentration distribution, lower iron loss of high frequency can be formed than a conventional high silicon steel sheet.

Best mode 6 has been made based on such knowledge.

(1) The best mode 6 provides a grain oriented silicon steel sheet having low iron loss and sheet thickness of 0.2 mm or more which is characterized in that content of C is 0.01 wt. % or less; portion of Si concentration of 5 to 8 wt. % is 10% or more of sheet thickness in sheet thickness depth direction from both upper surface layer and lower surface layer of a steel sheet; and Si concentration in neighborhood of sheet thickness center is 2.2 to 3.5 wt. %.

(2) A grain oriented silicon steel sheet having low iron loss and sheet thickness of less than 0.2 mm is characterized in that content of C is 0.01 wt. % or less; portion of Si concentration of 5 to 8 wt. % is 10% or more of sheet thickness in sheet thickness direction from both upper surface layer and lower surface layer of a steel sheet; and Si concentration in neighborhood of sheet thickness center is 3.0 to 6.0 wt. %.

(3) A grain oriented silicon steel sheet of (1) or (2), characterized in that portion of Si concentration of surface layer of 6.3 to 6.7 wt. % is 10% or more of sheet thickness in sheet thickness depth direction from both upper surface layer and lower surface layer of the steel sheet.

(4) The best mode 6 provides a grain oriented silicon steel sheet of any one of (1) through (3), characterized in that a silicon steel sheet has organic film or inorganic and organic mixed film as insulation film.

Now the best mode 6 will be described in detail hereinafter.

A silicon steel sheet of the best mode 6 is a grain oriented silicon steel sheet having what is called Goss grain or crystalline orientation close to Goss grain, and basically as described above, it is characterized in that content of C is 0.01 wt. % or less; portion of Si concentration of 5 to 8 wt. % is 10% or more of sheet thickness in sheet thickness depth direction from both upper surface layer and lower surface layer of a steel sheet, and preferably 15 to 20%; and Si concentration in neighborhood of sheet thickness center is 2.2 to 3.5 wt. % in case of sheet thickness of 0.2 mm or more and 3.0 to 6.0 wt. % in case of sheet thickness of less than 0.2 mm.

Firstly, in the best mode 6, content of C is defined to be 0.01 wt. % or less. Since in case of a silicon steel sheet containing about 3 wt. % of Si C causes magnetic aging, it is defined to be 0.005 wt. % or less. But in case that amount of Si is high, aging is suppressed, and it is allowed to be contained to the extent of about 0.02 wt. %. If, however, Si concentration distribution is formed, C forms adverse concentration distribution. That is to say, concentration distribution in which surface layer portion is low and sheet thickness center portion is high is formed, and in high C concentration portion magnetic aging is invited. C concentration of high concentration portion sometimes becomes 2 times of average value, and in the best mode 6, C is defined to be 0.01 wt. % or less.

Subsequently, in the best mode 6, Si concentration of both upper surface layer and lower surface layer is defined to be 5 to 8 wt. %, preferably to be 6.3 to 6.7 wt. %, and particularly preferably to be 6.6 wt. %. This is because iron loss property is excellent in this range. In range of less than 5 wt. % which is out of range of the present invention iron loss property is deteriorated and if over 8 wt. %, formability of a steel sheet is remarkably deteriorated. In addition, the reason why 10% or more of sheet thickness in sheet depth direction is because effect of iron loss reduction is remarkable, and if less than 10%, effect of iron loss reduction is not sufficiently displayed.

Figure 13:
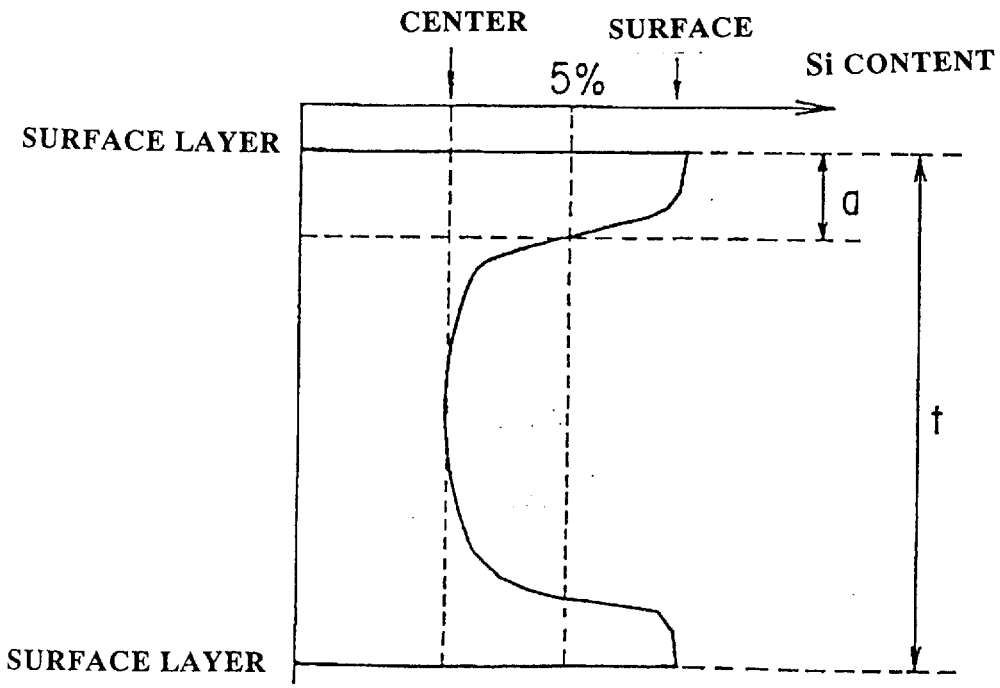
FIG. 13 is a view of showing one example of Si concentration distribution in order to define depth ratio of a portion having Si concentration of 5 wt. % or more from a surface layer by dep (%)=(a/t)×100 when depth is made to be a and sheet thickness to be t at time when Si concentration is 5 wt. % in respect of best mode 6.

The present inventors have ascertained this fact in the following experiment. That is to say, they have investigated dependency on depth ratio dep(%) of portion, where Si concentration is 5 wt. % or more from surface layer, of iron loss $W_{1/10}$ (iron loss value at frequency of 10 kHz and magnetic flux density of 1 k Gauss) in case of forming Si concentration in sheet thickness direction. The results are shown in FIG. 1. As shown in FIG. 13, depth ratio of portion where Si concentration is 5 wt. % or more is defined by the following formula.

$$\text{dep}(\%) = (a/t) \times 100$$

where a: depth in which Si concentration is 5 wt. % and t: sheet thickness

Figure 12:
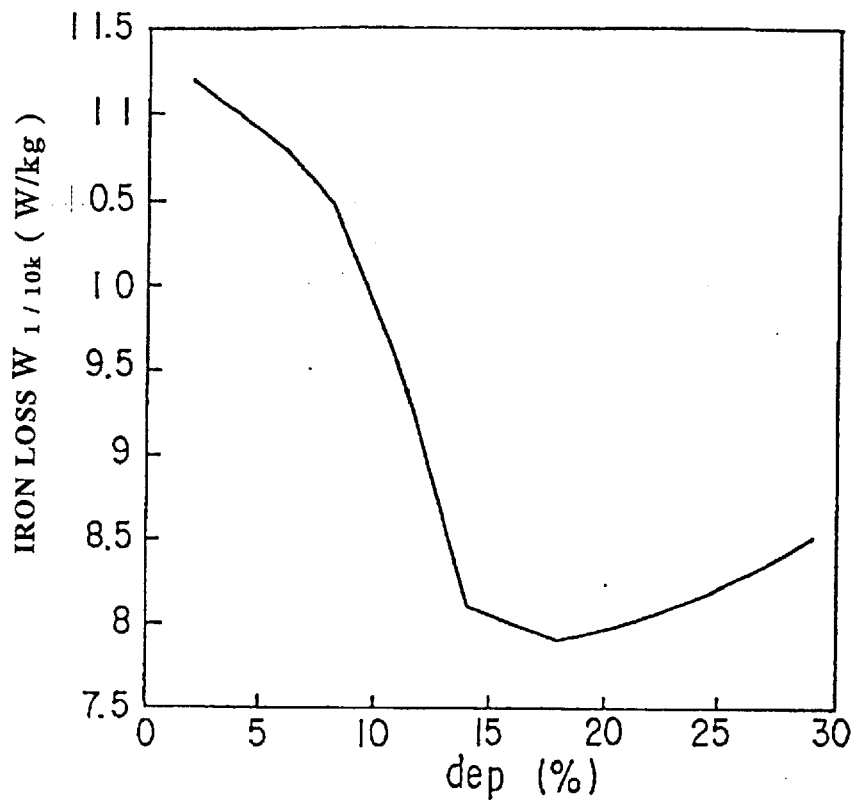
FIG. 12 is a view of showing dependence of iron loss W 1/10 k (iron loss value at frequency of 10 kHz and with magnetic flux density of 1 kGauss) on dep (%) of depth ratio of a portion having Si concentration of 5 wt. % or more from a surface layer in case that Si concentration distribution is formed in sheet thickness direction in respect of best mode 6.

In case that Si concentration distribution is asymmetric value of a of face and the reverse is averaged. Si concentration is result of analysis by EPMA (an electron probe micro-analyzer) with regard to section of a sample. In addition, here a grain oriented silicon steel sheet of 3.1% having sheet thickness of 0.23 mm was subjected to siliconizing treatment at atmosphere of $SiCl_4$ at 1200° C., and thereafter was subjected to diffusing treatment at atmosphere of $N_2$ at 1200° C. using samples which formed various Si concentration distributions. From FIG. 12 it is ascertained that if depth ratio of portion where Si concentration from surface layer is 5 wt. % or more is defined to be 10% or more, and more preferably to be 15 to 25%, iron loss is remarkably reduced.

Furthermore, lower limit of Si concentration in neighborhood of sheet thickness center is defined to be 2.2 wt. % in case that sheet thickness is 0.2 mm or more and to be 3.0 wt. % in case that sheet thickness is less than 0.2 mm. That is to say, if it has transformation point, at time of passing through transformation point by heat treatment it is made to be fine grain and magnetic property is remarkably impaired. Since owing to this from necessity of being α single phase lower limit value of Si concentration of low Si concentration portion of sheet thickness center portion is defined to be 2.2 wt. %. In case that sheet thickness is thinner than 0.2 mm, however, since ratio of hysteresis loss increases it is necessary that high frequency hysteresis loss is suppressed as higher Si including sheet thickness center portion. For this reason, lower limit value is defined to be 3.0 wt. % in case that sheet thickness is less than 0.2 mm.

In addition, upper limit of Si concentration in neighborhood of sheet thickness center is defined to be 3.5 wt. % in case that sheet thickness is 0.2 mm or more and to be 6.0 wt. % in case that sheet thickness is less than 0.2 mm. That is to say, upper limit of Si concentration of low Si concentration portion of sheet thickness center portion has preferably lower difference than Si concentration of surface layer as much as possible. For this reason, upper limit is defined to be 3.5 wt. %. In case that sheet thickness is less than 0.2 mm, however, in order to avoid increase of iron loss owing to increase of hysteresis loss, it is necessary to heighten upper limit and upper limit is defined to be 6.0 wt. %.

In BEST MODE 6, elements other than Si and C are not especially defined, and the other elements are allowable so long as they are contained in amount which is included in a usual silicon steel sheet.

In the best mode 6, in order to realize low iron loss, it is suitable that a silicon steel sheet has organic film or inorganic and organic mixed film as insulation film. That is to say, reason why by formation of concentration distribution iron loss becomes low is because high Si layer of high magnetic permeability is formed in surface layer. As insulation film, film including forsterite and TiN which produce residual stress reduce magnetic permeability remarkably, and as the result, low iron loss property is remarkably impaired. In order to avoid this, it is good that a silicon steel sheet has organic film or inorganic and organic mixed film which produce less residual stress.

Figure 14:
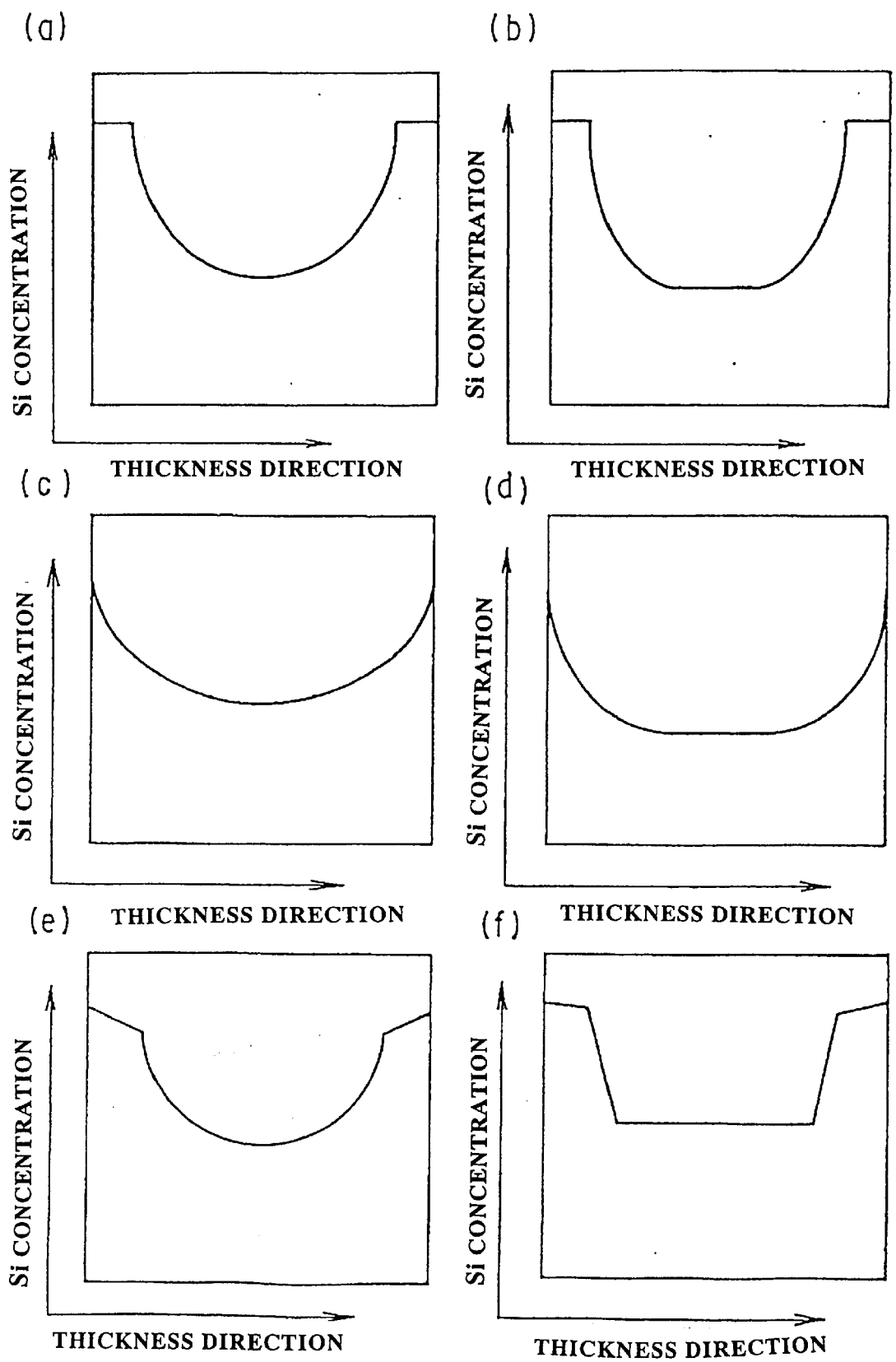
FIG. 14(a) through (f) is a view of showing typically various examples of Si concentration distributions in respect of best mode 6.

Method of forming high Si concentration portion of steel sheet surface layer may be any method of CVD, PVD, plating, clad and other which accompany diffusing treatment as process to follow thereafter, and is not especially defined. In addition, one example of Si concentration distribution is shown in FIG. 13 and even if distributions are ones shown typically in (a) through (f) of FIG. 14, similar effect of iron loss reduction can be obtained.

EXAMPLES

Example 1

(Covering Sheet Thickness of 0.2 mm or More)

A grain oriented steel sheet having composition shown in Table 8 and sheet thickness of 0.23 mm was subjected to siliconizing treatment at atmosphere of $SiCl_4$ at 1200° C., and thereafter was subjected to diffusing treatment at atmosphere of $N_2$ at 1200° C. to produce silicon steel sheets having various Si concentration distributions. Si concentration distributions were analyzed by EPMA (an electron probe micro-analyzer) with regard to section of samples. Elements other than Si hardly changed before and after siliconizing treatment and diffusing treatment. Film was made to be inorganic and organic mixed film.

From the steel sheets thus produced samples in L direction were taken, and after strain relief annealing alternating current magnetic property at frequency of 10 kHz and at magnetic flux density of 0.1 T was measured using an Epstein tester. Si concentration distribution and magnetic property are shown in Table 9. From Table 9 according to the present invention, a grain oriented silicon steel sheet having extremely low iron loss of high frequency was obtained.

Example 2

(Covering Sheet Thickness of Less than 0.2 mm)

A grain oriented silicon steel sheet having composition shown in Table 8 and sheet thickness of 0.05 to 0.15 mm was subjected to siliconizing treatment at atmosphere of $SiCl_4$ at 1150° C., and thereafter was subjected to diffusing treatment at atmosphere of $N_2$ at 1150° C. to produce silicon steel sheets having various Si concentration distributions. Si concentration distributions were analyzed by EPMA (an electron probe micro-analyzer) with regard to section of samples. Elements other than Si hardly changed before and after siliconizing treatment and diffusing treatment. Film was made to be inorganic and organic mixed film.

From the steel sheets thus produced samples in L direction were taken, and alternating current magnetic property at frequency of 10 kHz and at magnetic flux density of 0.1 T was measured. Si concentration distribution and magnetic property are shown in Table 10. If from Table 10 examples of the present invention and those which are out of range of the present invention are compared, it has been ascertained that according to the present invention, a grain oriented silicon steel sheet having extremely low iron loss of high frequency is obtained.

Example 3

Forming insulation film including forsterite on a steel sheet of No. 1 in Table 9 of Example 1, iron loss (at frequency of 10 kHz and at magnetic flux density of 0.1 T) was measured. Iron loss was 10.7 W/kg. If from this Table examples of the present invention and those which are out of range of the present invention are compared, it has been ascertained that according to the present invention, a grain oriented silicon steel sheet having extremely low iron loss of high frequency is obtained.

TABLE 8

| C | Si | Mn | P | S | sol. Al | N |
|---|----|----|----|----|---------|---|
| 0.002 | 2.9 | 0.09 | 0.019 | 0.023 | 0.025 | 0.005 |

TABLE 9

| No. | Si concentration of most outside surface layer (wt. %) | Thickness of 5% or more of Si (%) | Si concentration of sheet thickness portion (wt. %) | Iron loss (W/kg) | Remarks |
|---|---|---|---|---|---|
| 1 | 6.6 | 15 | 2.9 | 8.1 | Present invention |
| 2 | 3.1* | 0* | 2.9 | 15.7 | Comparative material |
| 3 | 6.6 | 4* | 2.9 | 11.0 | Comparative material |
| 4 | 7.2 | 12 | 2.9 | 8.9 | Present invention |
| 5 | 5.8 | 18 | 2.9 | 8.0 | Present invention |
| 6 | 5.8 | 20 | 4.5* | 10.5 | Comparative material |
| 7 | 4.5* | 15 | 2.9 | 11.2 | Comparative material |

TABLE 10

| No. | Sheet thickness (mm) | Si concentration of most outside surface layer (wt. %) | Thickness of 5% or more of Si (%) | Si concentration of sheet thickness portion (wt. %) | Iron loss (W/kg) | Remarks |
|---|---|---|---|---|---|---|
| 8 | 0.1 | 6.5 | 17 | 4.1 | 4.2 | Present invention |
| 9 | 0.1 | 6.5 | 11 | 2.9* | 6.0 | Comparative material |
| 10 | 0.1 | 6.5 | 6* | 3.6 | 6.5 | Comparative material |
| 11 | 0.05 | 6.6 | 19 | 5.8 | 2.6 | Present invention |
| 12 | 0.05 | 5.9 | 25 | 5.1 | 2.8 | Present invention |
| 13 | 0.05 | 2.9* | 0* | 2.9* | 7.1 | Comparative material |
| 14 | 0.05 | 5.9 | 17 | 2.9* | 6.8 | Comparative material |

Best Mode 7

It is known that magnetic aging is produced even in a usual silicon steel sheet if soluble C remains therein. In order to prevent this magnetic aging, it is known that C is made to be 50 ppm or less. According to the results of study of the present inventors, in case of a silicon steel sheet having Si concentration gradient, even if C is 50 ppm or less large magnetic aging deterioration is invited and iron loss increases compared with an ordinary silicon sheet which has not Si concentration gradient.

The present inventors have investigated this cause, and as the results, it has been ascertained that if Si concentration gradient is formed C has also uneven concentration distribution and that region of high C concentration is formed to invite aging. That is to say, in case that Si concentration has concentration distribution in which Si concentration is high in steel sheet surface and is low in sheet thickness center portion, C concentration distribution is low in steel sheet surface and high in sheet thickness center portion. Concentration in the highest C concentration portion has 2 to 5 times of average concentration in sheet thickness direction. This is to be inferred because C chemical potential changes by Si and C is discharged from high Si concentration portion to low Si concentration portion.

If such C concentration distribution is formed, since high C region naturally makes aging a steel sheet makes aging as a whole. Therefore, aging occurs even if average C concentration is low in sheet thickness direction.

The present inventors have found that in order to obtain a silicon steel sheet of low residual magnetic flux density while preventing such magnetic aging, it is effective that average C concentration is made to be low so as not to invite aging even in high C region. Furthermore, they have found that it is also effective that Si concentration distribution is formed taking also into consideration making the highest Si concentration low or making high Si concentration region small.

Best mode 7 has been made based on the above described knowledge, providing a silicon steel sheet excellent in magnetic aging property and having low residual magnetic flux density which is characterized in that the silicon steel sheet consists of 0.003 wt. % or less C, 0.05–0.5 wt. % Mn, 0.01 wt. % or less P, 0.02 wt. % or less S, 0.001–0.06 wt. % sol. Al and 0.01 wt. % or less N; it contains Si of 7 wt. % or less in average; it has Si concentration gradient in sheet thickness direction; Si concentration of surface is higher than Si concentration of sheet thickness center portion; and difference between maximum and minimum of Si concentration is 0.5 wt. % or more. In this case, it is preferable that difference between maximum and minimum of Si concentration is 0.7 wt. % or more. In addition, it is preferable that content of C is 0.0025 wt. % or less.

In addition, the best mode 7 provides a silicon steel sheet excellent in magnetic aging property and having low residual magnetic flux density and low iron loss which is characterized in that the silicon steel sheet consists of 0.003 wt. % or less C, 0.05–0.5 wt. % Mn, 0.01 wt. % or less P, 0.02 wt. % or less S, 0.001–0.06 wt. % sol. Al and 0.01 wt. % or less N; it contains Si of 7 wt. % or less in average; it has Si concentration gradient in sheet thickness direction; Si concentration of surface is higher than Si concentration of sheet thickness center portion; and difference between maximum and minimum of Si concentration is 0.5 to 5.5 wt. %. In this case, it is preferable that content of C is 0.0025 wt. % or less.

Now the best mode 7 will be concretely described.

As described above, it is necessary for a silicon steel sheet which is used as an iron core material to have low residual magnetic flux density, and for the purpose it is effective to form Si concentration gradient in sheet thickness direction. Since accompanied by the formation of Si concentration gradient, however, C concentration distribution is formed, there is possibility of occurrence of magnetic aging even if C concentration is low as a whole.

The present invention prevents magnetic aging which is caused by such C, premising that Si concentration gradient in sheet thickness direction is formed to lower residual magnetic flux density. For the purpose, C concentration of the whole of a steel sheet is defined to be 0.003 wt. % or less.

Figure 15:
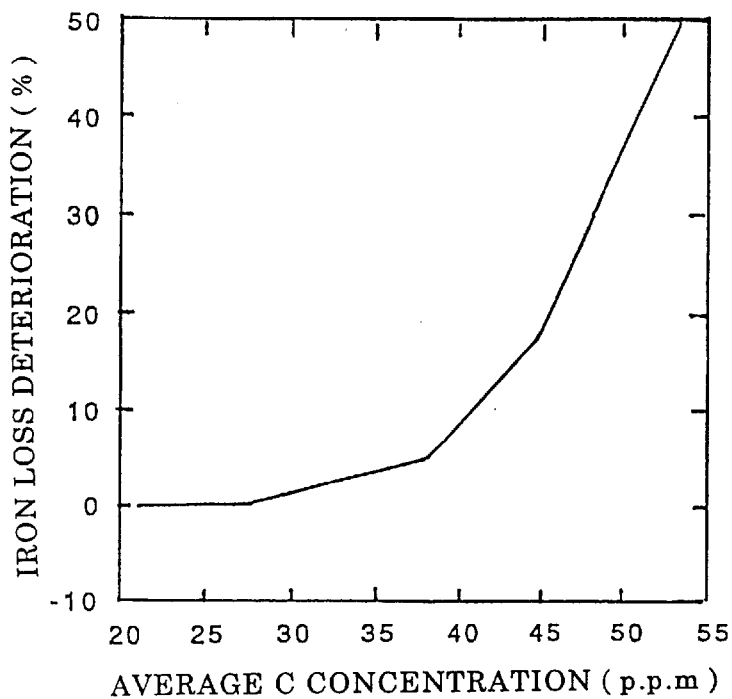
FIG. 15 is a view of showing relation between C concentration on average of a silicon steel sheet having a slope of Si concentration in sheet thickness direction and magnetic aging property in respect of best mode 7.

In case that Si concentration difference (difference between maximum Si concentration and minimum Si concentration) is 6.9 wt. % and average Si concentration is 4.5 wt. % where large C concentration distribution is formed, relation between average C concentration and iron loss deterioration ratio owing to magnetic aging is shown in FIG. 15. In this case, magnetic aging is evaluated by accelerating test of 150° C. for 2 weeks. From this figure it is ascertained that by forming Si concentration gradient in sheet thickness direction aging is easier to occur than in case of a usual silicon steel sheet, and magnetic aging occurs if C is over 30 ppm, i.e., 0.003 wt. %. Therefore, in the present invention, C concentration is defined to be 0.003 wt. % or less.

Under severer environment, even in case of a usual silicon steel sheet in order to prevent magnetic aging C is made to be 30 ppm or less. Supposing such a severe use environment, test was carried out under accelerating aging condition of 200° C. for 100 hours. As the results of the test, it has been ascertained that in order to make iron loss deterioration amount owing to aging 5% or less it is necessary to make C 25 ppm or less. Therefore, in the present invention, content of C is preferably defined to be 0.0025 wt. % or less.

Figure 16:
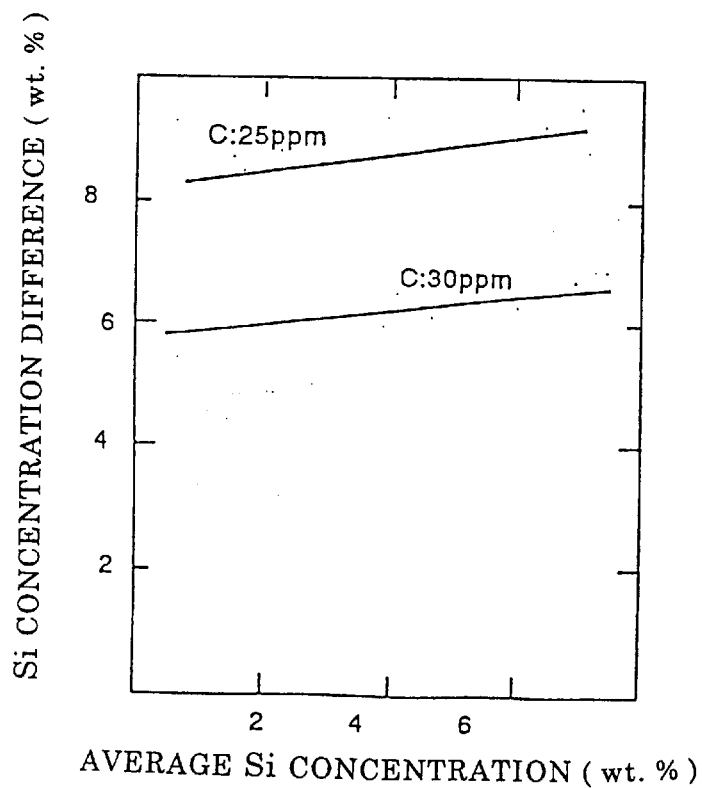
FIG. 16 is a view of showing relation between Si concentration distribution and C concentration which has aging deterioration of 5% or less in respect of best mode 7.

What was described above showed the condition of preventing magnetic aging by limiting C amount. As described before, magnetic aging can be prevented or suppressed by adjusting Si concentration distribution. That is to say, by making difference of Si concentration small, aging can be prevented or suppressed. FIG. 16 shows test result of C amount which makes iron loss increase ratio after accelerating aging of 150° C. for 2 weeks 5% or less with regard to a silicon steel sheet having various Si concentration. Si concentration distribution is represented by average Si amount and Si concentration difference. From FIG. 2 it has been ascertained that if Si concentration difference is 5.5 wt. % or less aging deterioration is 5% or less even if C amount is 30 ppm. Therefore, as preferable condition in the present invention, Si concentration difference is defined to be 5.5 wt. % or less on the premise that content of C is 0.003 wt. % or less.

It is necessary for a silicon steel sheet of the present invention to have low residual magnetic flux density, and the low residual magnetic flux density can be attained by forming Si concentration gradient in sheet thickness direction as described above. Concretely difference between maximum Si concentration and minimum Si concentration is defined to be 0.5 wt. % or more and more preferably to be 0.7 wt. % or more. In addition, if average Si concentration is over 7 wt. %, a material becomes brittle and is hard to work. Therefore, the upper limit of Si concentration is defined to be 7 wt. %.

Subsequently, reason for limiting elements other than C and Si will be described.

If Mn is contained much, a steel sheet becomes brittle. For the reason the upper limit is defined to be 0.5 wt. %. If the content, however, is too low, fracture and surface defect are invited during hot rolling. For the reason, the lower limit is defined to be 0.05 wt. %.

P is a preferable element from magnetic property point of view. Since, however, formability of a steel sheet is deteriorated if it is contained much, the upper limit is defined to be 0.01 wt. %. The lower limit is not especially limited, but it is preferably defined to be 0.001 wt. % from economically removing point of view.

Since S deteriorates formability, it is necessary for the upper limit to be defined to be 0.02 wt. %. The lower limit is not especially limited, but it is preferably defined to be 0.001 wt. % from economically removing point of view.

Since sol. Al deteriorates formability similarly, the upper limit is defined to be 0.06 wt. %. On the other hand, from necessity of being as deoxidizer the lower limit is defined to be 0.001 wt. %.

If N is contained much, nitride is formed to deteriorate magnetic property. For the reason, it is necessary for the upper limit to be defined to be 0.01 wt. %. The lower limit is not especially limited, but it is in fact defined to be 0.0001 wt. % considering steel-making technology at present.

A silicon steel sheet having Si concentration gradient according to BEST MODE 7 can be produced by various methods, and the methods for production thereof are not limited. The silicon steel sheet having Si concentration gradient can be produced, for example, by chemical vapor deposition (CVD, siliconizing treatment) method, physical vapor; deposition (PVD) method, cladding technology and plating technology.

As an example, production method by CVD method will be described. Firstly, for example, a cold rolled strip coil of 3 wt. % silicon steel is produced by a usual steel sheet production process. This coil is subjected to CVD treatment to produce a steel sheet having Si concentration gradient. That is to say, the coil is heated to 1100° C. or more at non-oxidizing atmosphere to be reacted with $SiCl_4$ gas to form Fe—Si layer of high Si concentration on surface. Subsequently diffusing treatment is carried out and Si is diffused in the steel sheet with necessary amount to produce a silicon steel sheet having average Si amount and Si concentration gradient which are aimed at.

In the present invention, average Si concentration means mean value of Si concentration with regard to whole sheet thickness, and can be obtained, for example, by performing chemical analysis of product thickness as it is. In addition, maximum Si concentration and minimum Si concentration can be determined from Si concentration profile which is obtained by performing EPMA analysis of whole sheet thickness. Furthermore, concentration of elements other than Si is concentration of a product. Still furthermore, residual magnetic flux density is value after excitation magnetism of 1.2 T in direct current.

In addition, increase ratio of the above described iron loss is represented by % in the following formula by measuring iron loss ($W_{12/50}$) before and after aging:

(iron after accelerating aging−iron loss before aging)÷(iron loss before aging)

Even if as iron loss $W_{1/10}$ is used, similar result is obtained.

EXAMPLE

Steel sheets having composition shown in Table 11 (composition other than Si is that of a commercial product, and composition of Si is that before CVD treatment) and sheet thickness of from 0.05 to 0.5 mm were produced by usual steel production process. These steel sheets were subjected to CVD treatment to obtain steel sheets having various Si average concentrations and concentration distributions. Not only residual magnetic flux densities of these steel sheets were measured but also iron loss increase ratios were obtained by subjecting these steel sheets to accelerating aging treatment of 150° C. for 2 weeks. The results are shown in Table 12. It has been ascertained that as shown in Table 12 in the present invention silicon steel sheets having no magnetic aging deterioration or having extremely small and low residual magnetic flux density can be obtained.

TABLE 11

| | wt. % | | | | | |
|---|---|---|---|---|---|---|
| | C | Si | Mn | P | S | sol. Al | N |
| A | 0.0022 | 0.3 | 0.09 | 0.006 | 0.004 | 0.005 | 0.0033 |
| B | 0.0028 | 0.3 | 0.06 | 0.008 | 0.010 | 0.005 | 0.0022 |
| C | 0.0037 | 0.4 | 0.10 | 0.008 | 0.008 | 0.005 | 0.0028 |
| D | 0.0023 | 3.1 | 0.10 | 0.005 | 0.004 | 0.004 | 0.0027 |
| E | 0.0029 | 3.0 | 0.06 | 0.006 | 0.008 | 0.006 | 0.0034 |
| F | 0.0048 | 3.0 | 0.06 | 0.007 | 0.005 | 0.005 | 0.0035 |

TABLE 12

| No. | Material | Average Si concentration (wt. %) | Si concentration difference (wt. %) | Residual magnetic flux density (T) | Aging deterioration amount (%) | Remarks |
|---|---|---|---|---|---|---|
| 1 | A | 3.5 | 6.1 | 0.14 | 0 | Present invention |
| 2 | B | 3.5 | 6.0 | 0.15 | 2 | Present invention |
| 3 | C | 3.5 | 6.1 | 0.14 | 10 | Comparative material |
| 4 | D | 4.0 | 2.5 | 0.31 | 0 | Present invention |
| 5 | E | 4.0 | 2.5 | 0.30 | 0 | Present invention |
| 6 | F | 4.0 | 2.6 | 0.30 | 35 | Comparative material |
| 7 | D | 3.5 | 5.8 | 0.16 | 0 | Present invention |
| 8 | E | 3.5 | 5.8 | 0.16 | 3 | Present invention |
| 9 | F | 3.5 | 6.0 | 0.15 | 36 | Comparative material |

Best Mode 8

Best mode 8 provides a method for producing a silicon steel sheet having Si concentration distribution using siliconizing method which is characterized in that siliconizing treatment which penetrates Si from surface of a steel sheet and diffusing treatment which diffuses the penetrated Si in the steel sheet are carried out within the same furnace at atmosphere of the same gas; by controlling treatment time and treatment interval of the siliconizing treatment and the diffusing treatment, siliconizing rate and diffusing rate are controlled; and Si concentration in steel sheet thickness direction is controlled.

In this case, an inside of the said furnace is divided into plurality of zones; and supply amount of raw material gas in each of the divided zones can be adjusted. In addition, the said siliconizing treatment and the said diffusing treatment can be carried out by using chemical vapor deposition (herein after referred to as CVD) method. Furthermore, the said siliconizing treatment and the said diffusing treatment by CVD method can be carried out by using SiCl$_4$.

Since according to the best mode 8, the siliconizing treatment and the diffusing treatment are carried out within the same furnace at atmosphere of the same gas, a furnace construction such as partition can be removed and a furnace constitution can be simplified. In addition, by carrying out the siliconizing treatment and the diffusing treatment at atmosphere of the same gas in this manner, water and oxygen concentration of the diffusing treatment atmosphere can be reduced, and oxidization of a steel sheet at soaking and diffusing treatment stage can be suppressed. Thus deterioration of quality of a product can be prevented. Furthermore, since treatment time and treatment interval of the siliconizing treatment and the diffusing treatment are controlled, for example, adjustment of silicon concentration of sheet thickness center is carried out at initial siliconizing stage and after sufficient diffusing treatment is given, siliconizing treatment which aims at giving concentration gradient can be carried out. Thus, by high flexibility of treatment desired magnetic property can be obtained.

According to the best mode 8 in producing a silicon steel sheet having Si concentration distribution using siliconizing method, siliconizing treatment which penetrates Si from surface of a steel sheet and diffusing treatment which diffuses the penetrated Si in the steel sheet are carried out within the same furnace at atmosphere of the same gas; and by controlling treatment time and treatment interval of the siliconizing treatment and the diffusing treatment, Si concentration in thickness direction is controlled. Such controlling Si concentration distribution can be carried out by adjusting raw material supply partially in the furnace.

Now the siliconizing treatment and the diffusing treatment are typically carried out by CVD treatment by means of gas including Si. And the conventional siliconizing treatment and diffusing treatment are carried out within the same furnace and at the same atmosphere including gas inclusive of Si.

Gas including Si which is used for treatment is not especially limited, and SiH$_4$, Si$_2$H$_5$ and SiCl$_4$ can be used. Among them, however, SiCl$_4$ is preferable. In case that as treatment gas SiCl$_4$ is used, it is preferable that treatment temperature is made to be in range of 1023 to 1250° C. In addition, concentration of SiCl$_4$ at time of siliconizing treatment and diffusing treatment is preferably in range of 0.02 to 35 mol %.

Figure 17:
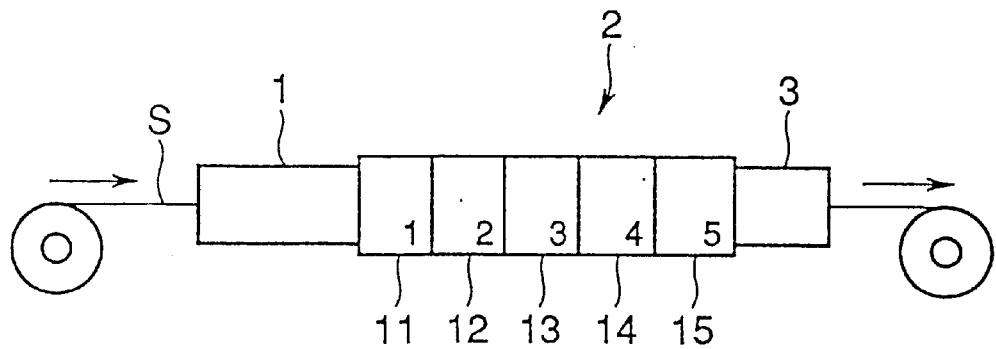
FIG. 17 is a schematic structural view of one example of an apparatus which practices a method of best mode 8.

Such treatment can be carried out, for example, by an apparatus shown in FIG. 17. This apparatus is arranged in the order of a heating furnace 1, a siliconizing and diffusing furnace 2 and a cooling furnace 3, and a steel sheet S is continuously treated. The steel sheet is heated at the heating furnace 1, for example, to 1200° C. and SiCl$_4$ gas is introduced into the siliconizing and diffusing furnace 2.

The siliconizing and diffusing furnace 2 has a first zone 11, a second zone 12, a third zone 13, a fourth zone 14 and a fifth zone 15 and, each of the zones is provided with nozzle through which SiCl$_4$ gas is introduced. Accordingly, by controlling flow rate of SiCl$_4$ gas in each of the zones, treatment time and treatment interval of the siliconizing treatment and the diffusing treatment can be controlled. For example, several times of silicon addition (siliconizing) and diffusing can be continuously practiced. By controlling flow rate of SiCl$_4$ gas in each of the zones in this manner and furthermore by adjusting moving rate of the steel sheet S at need siliconizing rate and diffusing rate can be controlled with regard to the steel sheet and Si concentration distribution in sheet thickness direction can be optionally controlled. Thereafter the steel sheet S of which concentration distribution has been controlled is cooled at the cooling furnace 3 to be coiled.

By carrying out the siliconizing treatment and the diffusing treatment in this manner within the same furnace and at atmosphere of the same SiCl$_4$ gas by the siliconizing and diffusing furnace 2, not only the furnace constitution can be simplified but also oxidization of a steel sheet which has been conventionally a problem in a diffusing furnace can be suppressed. In addition, since by controlling flow rate of SiCl$_4$ gas in each of the zones, atmosphere adjustment of the siliconizing and diffusing furnace 2 can be partially carried out, the siliconizing treatment and the diffusing treatment are easily controlled and resultantly controlling of Si concentration distribution becomes easy. Therefore, extremely high flexibility of treatment can be carried out.

EXAMPLE

A material having Si concentration gradient in sheet thickness direction was produced by the apparatus as shown in the above described FIG. 17 and by continuous siliconizing process using CVD method, making a steel sheet on 2 levels of 2.5 wt. % Si and 3.0 wt. % Si with thickness of 0.2 mm as a mother material and using SiCl$_4$ as raw material gas.

Figure 18:
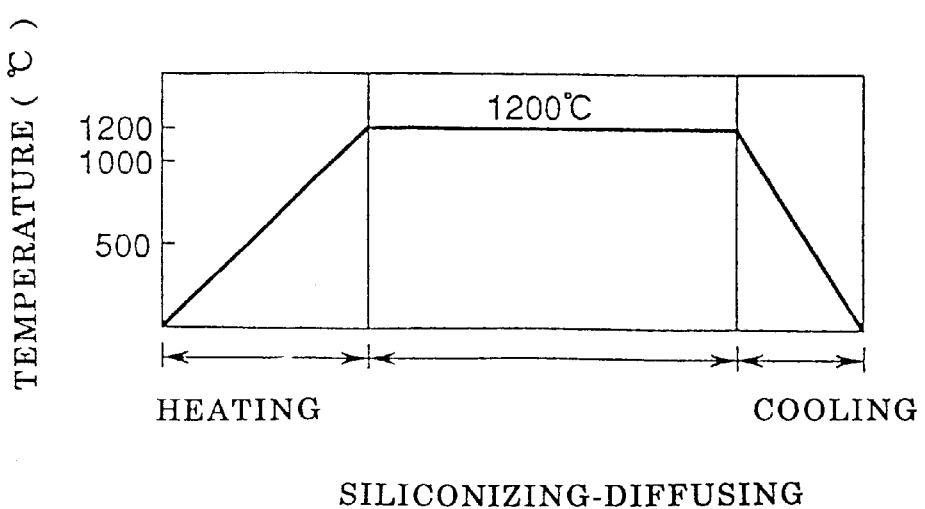
FIG. 18 is a view of furnace temperature distribution in respect of an example of best mode 8.

An inside of the siliconizing and diffusing furnace 2 is divided into five zones as described above and each of the zones is provided respectively with gas supply nozzle. By controlling flow rate of SiCl$_4$ gas in each of the zone, several times of silicon addition and diffusing were continuously practiced. Furnace temperature was carried out with furnace temperature pattern shown in FIG. 18. For comparison, production was also carried out by conventional method in which siliconizing treatment and diffusing treatment are individually practiced.

Those production conditions and silicon concentration of surface layer, silicon concentration value of center, magnetic property and formability which based on the results of analysis of silicon concentration distribution in steel sheet thickness direction by an electron probe micro-analyzer (EPMA) are shown in Table 13.

As shown in Table 13, under conditions of 1 to 4 in which treatment was carried out according to the present invention, Si concentration gradient can be finely controlled, and a silicon steel sheet which has low residual magnetic flux density and good formability can be obtained while iron loss is kept to be within allowable value. In contrast to this, a comparative example shows low flexibility of treatment, that which has Si concentration of 6.5 wt. % and of being uniform or that which has surface with 6.5 wt. % Si and center Si concentration equal to mother material concentration was obtained, but it has been confirmed that satisfactory property is hard to obtain.

TABLE 13

| Condition | Si concentration of mother material (wt. %) | Si concentration of surface layer (wt. %) | Si concentration of center (wt. %) | Supply zone of SiCl$_4$ gas | Non-supply zone of SiCl$_4$ gas | Residual magnetic flux density Br$_{12/DC}$ (T) | Iron loss W$_{10/400}$ (W/kg) | Iron loss W$_{1/10\,k}$ (W/kg) | Minimum bending radius (mm) |
|---|---|---|---|---|---|---|---|---|---|
| 1 | 2.5 | 6.51 | 3.02 | 1, 4 | 2, 3, 5 | 0.36 | 14.5 | 12.7 | 0.0 |
| 2 | 3.0 | 6.55 | 3.01 | 4 | 1, 2, 3, 5 | 0.35 | 14.6 | 12.6 | 0.0 |
| 3 | 2.5 | 5.62 | 3.15 | 1, 4 | 2, 3, 5 | 0.29 | 12.6 | 18.6 | 0.0 |
| 4 | 3.0 | 5.70 | 3.20 | 1, 2 | 3, 4, 5 | 0.28 | 12.8 | 18.9 | 0.0 |
| Comparative example | 3.0 | 6.55 | 6.51 | — | — | 1.10 | 6.8 | 15.7 | 48.6 |
| Comparative example | 3.0 | 6.51 | 3.01 | — | — | 0.38 | 14.4 | 12.6 | 8.9 |

Best Mode 9

Best mode 9 provides a method for producing a silicon steel sheet using siliconizing method which is characterized in that siliconizing treatment which penetrates Si from surface of a steel sheet and diffusing treatment which diffuses the penetrated Si in the steel sheet are simultaneously carried out at the same atmosphere; and by controlling siliconizing rate and diffusing rate, Si concentration in steel sheet thickness direction is controlled.

The siliconizing treatment and the diffusing treatment can be carried out by using chemical vapor deposition (hereinafter referred to as CVD) method. In this case, the said siliconizing treatment and the said diffusing treatment by CVD method can be carried out by using SiCl$_4$.

Since according to the best mode 9, the siliconizing treatment and the diffusing treatment are carried out at the same atmosphere, a furnace construction such as partition can be removed and a furnace constitution can be simplified. In addition, by carrying out the siliconizing treatment and the diffusing treatment at the same atmosphere in this manner, water and oxygen concentration of the diffusing treatment atmosphere can be reduced, and oxidization of a steel sheet at soaking and diffusing treatment stage can be suppressed. Thus deterioration of product quality can be prevented. Furthermore, since the siliconizing treatment and the diffusing treatment are simultaneously carried out, for example, adjustment of silicon concentration of sheet thickness center is carried out at initial siliconizing stage and after sufficient diffusing treatment is given, siliconizing treatment which aims at giving concentration gradient can be carried out. Thus, by high flexibility of treatment desired magnetic property can be obtained.

Now the best mode 9 will be concretely described.

According to the best mode 9, in producing a silicon steel sheet having Si concentration distribution using siliconizing method, siliconizing treatment which penetrates Si from surface of a steel sheet and diffusing treatment which diffuses the penetrated Si in the steel sheet are simultaneously carried out at the same atmosphere; and by controlling siliconizing rate and diffusing rate Si concentration in steel sheet thickness direction is controlled.

Now the siliconizing treatment and the diffusing treatment are typically carried out by CVD treatment by means of gas including Si. And the conventional siliconizing treatment and diffusing treatment are carried out within the same furnace and at the same atmosphere including gas inclusive of Si.

Gas including Si which is used for treatment is not especially limited, and $SiH_4$, $Si_2H_5$ and $SiCl_4$ can be used. Among them, however, $SiCl_4$ is preferable. In case that as treatment gas $SiCl_4$ is used, it is preferable that treatment temperature is made to be in range of 1023 to 1250° C. In addition, concentration of $SiCl_4$ at time of the siliconizing treatment and the diffusing treatment is preferably in range of 0.02 to 35 mol %.

Figure 19:
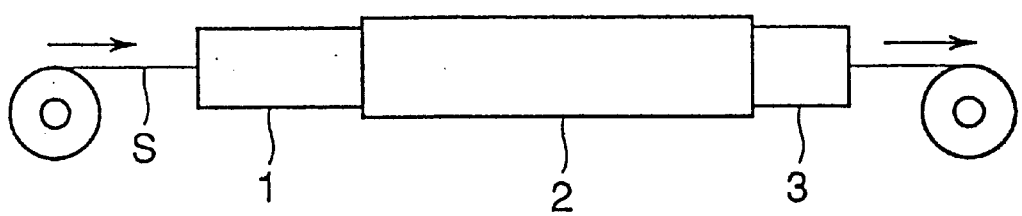
FIG. 19 is a schematic structural view of one example of an apparatus which practices a method of best mode 9.

Such treatment can be carried out, for example, by an apparatus shown in FIG. 19. This apparatus is arranged in the order of a heating furnace 1, a siliconizing and diffusing furnace 2 and a cooling furnace 3, and a steel sheet S is continuously treated. The steel sheet is heated at the heating furnace 1, for example, to 1200° C., $SiCl_4$ gas is introduced through an appropriate location at predetermined flow rate into the siliconizing and diffusing furnace 2, and by adjusting moving rate of the steel sheet S and by controlling siliconizing rate and diffusing rate with regard to the steel sheet S Si concentration distribution in steel sheet thickness is controlled. Thereafter the steel sheet S of which Si concentration distribution has been controlled in this manner is cooled at the cooling furnace 3 to be coiled.

By carrying out the siliconizing treatment and the diffusing treatment in this manner simultaneously at the same atmosphere by the siliconizing and diffusing furnace 2, not only the furnace constitution can be simplified but also oxidization of a steel sheet which has been conventionally a problem in a diffusing furnace can be suppressed. In addition, by adjusting atmosphere in the siliconizing and diffusing furnace 2, introducing location and flow rate of $SiCl_4$ gas and moving rate of the steel sheet S, Si concentration distribution is made to easily be controlled and extremely high flexibility of treatment can be carried out. Namely, if by controlling Si concentration distribution in this manner predetermined Si concentration gradient in which Si concentration of surface layer is higher than Si concentration of sheet thickness center portion is formed, more desirable property with regard to iron loss of high frequency, residual magnetic flux density and formability can be obtained. In addition, in case that by such controlling, a silicon steel sheet having uniform Si concentration is produced, iron loss of from commercial frequency region to region just before high frequency domain can be made to be more desirable value. And in the vicinity of Si concentration of 6.5 wt. %, that which is excellent in magnetic strain property and formability can be obtained.

EXAMPLE

A material having Si concentration gradient in sheet thickness direction was produced by the apparatus as shown in the above described FIG. 1 and by continuous siliconizing treatment process using CVD method, making a steel sheet of 3.0 wt. % Si with thickness of 0.2 mm as a mother material and using $SiCl_4$ as raw material gas.

Figure 20:
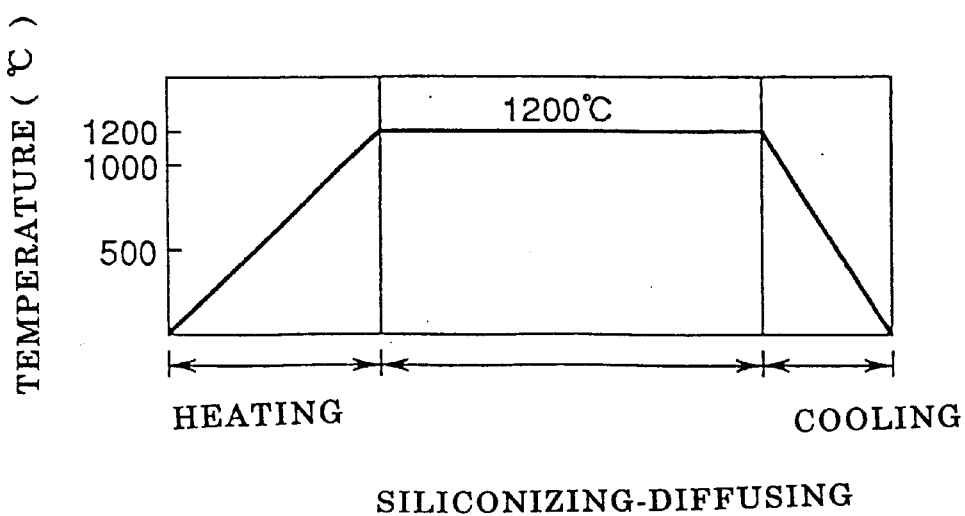
FIG. 20 is a view of furnace temperature distribution in respect of an example of best mode 9.

The production was carried out by adjusting supply location of $SiCl_4$ gas, flow rate of $SiCl_4$ and treatment rate (moving rate of the steel sheet). Furnace temperature was carried out with furnace temperature pattern shown in FIG. 20. Dependent on whether the first siliconizing treatment (siliconizing-diffusing-siliconizing) is carried out or not, that which varied silicon concentration of center and that which was subjected sufficiently to diffusing treatment were produced. For comparison, production was also carried out by conventional method in which siliconizing treatment and diffusing treatment are individually practiced.

Those production conditions and silicon concentration of surface layer, silicon concentration value of center, magnetic property and formability which are based on the results of analysis of silicon concentration distribution in steel sheet thickness direction by an electron probe micro-analyzer (EPMA) are shown in Table 14.

Under condition 1 shown in Table 14, thanks to application of the first siliconizing treatment, silicon concentration of steel sheet center portion increases by about 1% compared with condition 2, and it has been confirmed that by the first siliconizing treatment adjustment of silicon concentration of steel sheet center portion is possible. In addition, seeing that whole silicon concentration increases as magnetic property of condition 1 iron loss is somewhat inferior to condition 2 in high frequency region, but total iron loss including low frequency region is found to be improved.

In addition, under conditions 1, 2, Si concentration distribution in sheet thickness direction is formed, and iron loss and residual magnetic flux density in high frequency region are better than comparative example 1 which is of uniform material. Furthermore, since siliconizing treatment and diffusing treatment are simultaneously carried out, it has been confirmed that formability is remarkably improved even if Si concentration distribution is almost equal to comparative example 2 which was subjected to individual treatment.

Furthermore, under condition 3, siliconizing treatment and diffusing treatment are simultaneously carried out, Si is made to be diffused sufficiently and Si concentration is made to be high as a whole. It has been confirmed that formability is improved compared with comparative material 1 of which Si concentration is made by carrying out individual treatment to be high as a whole.

TABLE 14

| Condition | Treatment rate (mpm) | First siliconizing treatment | Si concentration of surface layer (wt. %) | Si concentration of center (wt. %) | Iron loss $W_{10/400}$ (W/kg) | Iron loss $W_{1/10\,k}$ (kg/kg) | Residual magnetic flux density $Br_{12/DC}$ (T) | Minimum bending radius (mm) |
|---|---|---|---|---|---|---|---|---|
| 1 | 12.0 | Yes | 6.55 | 4.05 | 12.7 | 12.6 | 0.43 | 0.0 |
| 2 | 12.0 | None | 6.52 | 3.03 | 14.8 | 12.1 | 0.36 | 0.0 |
| 3 | 4.0 | Yes | 6.47 | 6.42 | 6.8 | 15.7 | 1.10 | 41.5 |
| comparative example 1 | 4.0 | Individual treatment of siliconizing and diffusing | 6.45 | 6.41 | 6.9 | 15.9 | 1.10 | 49.7 |
| comparative example 2 | 12.0 | Individual treatment of siliconizing and diffusing | 6.53 | 3.04 | 14.8 | 12.3 | 0.37 | 9.1 |

What is claimed is:

1. A nonoriented silicon steel sheet having a low iron loss at high frequency, the silicon steel sheet comprising:

a steel sheet surface layer and a steel sheet center portion;

the silicon steel sheet having a Si concentration gradient in the steel sheet thickness direction so that the steel sheet surface layer has a Si concentration higher than the Si concentration of the steel sheet center portion;

the Si concentration of the steel sheet center portion being 3.57 wt. % to 4.79 wt. %;

the Si concentration of the steel sheet surface layer being 5 wt. % to 7.06 wt. %; and the silicon steel sheet having a thickness of 0.2 mm or less.

2. The nonoriented silicon steel sheet of claim 1, wherein said Si concentration of the steel sheet surface layer is 6.5 wt. %.

3. A nonoriented silicon steel sheet having low iron loss at high frequency, the silicon steel sheet comprising:

an upper surface layer, a lower surface layer and a steel sheet center portion;

the silicon steel sheet having a Si concentration gradient in the sheet thickness direction so that the upper surface layer and the lower surface layer have a Si concentration higher than the Si concentration of the steel sheet center portion;

the upper surface layer being at least 10% of the sheet thickness in the steel sheet thickness direction from the upper surface of the silicon steel sheet, and the lower surface layer being at least 10% of the sheet thickness in the steel sheet thickness direction from the lower surface of the silicon steel sheet;

the upper surface layer and the lower surface layer having a Si concentration of 5 to 7.06 wt. %;

the steel sheet center portion having a Si concentration of 3.57 wt. % to 4.79 wt. %; and the silicon steel sheet having a thickness of 0.2 mm or less.

4. The nonoriented silicon steel sheet of claim 1, wherein the silicon steel sheet consists essentially of:

0.02 wt. % or less C, 0.05–0.5 wt. % Mn, 0.01 wt. % or less P, 0.02 wt. % or less S, 0.001–0.06 wt. % sol.Al, and 0.01 wt. % or less N.

5. The nonoriented silicon steel sheet of claim 1, wherein the Si concentration of the steel sheet center portion is 4.12 wt. % to 4.79 wt. %.

6. The nonoriented silicon steel sheet of claim 1, wherein the Si concentration of the steel sheet surface layer is 5.58 wt. % to 7.06 wt. %.

7. The nonoriented silicon steel sheet of claim 6, wherein the Si concentration of the steel sheet surface layer is 6.12 wt. % to 6.54 wt. %.

8. The nonoriented silicon steel sheet of claim 2, wherein the silicon steel sheet consists essentially of:

0.02 wt. % or less C, 0.05–0.5 wt. % Mn, 0.01 or less P, 0.02 wt. % or less S, 0.001–0.06 wt. % sol.Al, and 0.01 wt. % or less N.

9. The nonoriented silicon steel sheet of claim 3, wherein the silicon steel sheet consists essentially of:

0.02 wt. % or less C, 0.05–0.5 wt. % Mn, 0.01 wt. % or less P, 0.02 wt. % or less S, 0.001–0.06 wt. % sol.Al, and 0.01 wt. % or less N.

10. The nonoriented silicon steel sheet of claim 1, wherein the silicon steel sheet has a thickness of 0.1 mm or less.

* * * * *